(12) United States Patent
Trivedi et al.

(10) Patent No.: US 12,249,622 B2
(45) Date of Patent: Mar. 11, 2025

(54) NANORIBBON THICK GATE DEVICES WITH DIFFERENTIAL RIBBON SPACING AND WIDTH FOR SOC APPLICATIONS

(71) Applicant: Intel Corporation, Santa Clara, CA (US)

(72) Inventors: Tanuj Trivedi, Hillsboro, OR (US); Rahul Ramaswamy, Portland, OR (US); Jeong Dong Kim, Scappoose, OR (US); Ting Chang, Portland, OR (US); Walid M. Hafez, Portland, OR (US); Babak Fallahazad, Portland, OR (US); Hsu-Yu Chang, Hillsboro, OR (US); Nidhi Nidhi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 991 days.

(21) Appl. No.: 16/713,684

(22) Filed: Dec. 13, 2019

(65) Prior Publication Data

US 2021/0184001 A1 Jun. 17, 2021

(51) Int. Cl.
*H01L 29/786* (2006.01)
*H01L 21/8234* (2006.01)
(Continued)

(52) U.S. Cl.
CPC .. *H01L 29/0673* (2013.01); *H01L 21/823431* (2013.01); *H01L 27/0886* (2013.01);
(Continued)

(58) Field of Classification Search
None
See application file for complete search history.

(56) References Cited

U.S. PATENT DOCUMENTS

| 10,243,054 B1 | 3/2019 | Cheng et al. |
| 2017/0104060 A1 | 4/2017 | Balakrishnan et al. |

(Continued)

OTHER PUBLICATIONS

Walid M. Hafez, et al., "Nanoribbon Thick Gate Device With Hybrid Dielectric Tuning for High Breakdown and VT Modulation" U.S. Appl. No. 16/713,703, filed Dec. 13, 2019, 63 pages.
(Continued)

*Primary Examiner* — Joseph C. Nicely
*Assistant Examiner* — Lamont B Koo
(74) *Attorney, Agent, or Firm* — Schwabe, Williamson & Wyatt P.C.

(57) ABSTRACT

Embodiments disclosed herein include nanowire and nanoribbon devices with non-uniform dielectric thicknesses. In an embodiment, the semiconductor device comprises a substrate and a plurality of first semiconductor layers in a vertical stack over the substrate. The first semiconductor layers may have a first spacing. In an embodiment, a first dielectric surrounds each of the first semiconductor layers, and the first dielectric has a first thickness. The semiconductor device may further comprise a plurality of second semiconductor layers in a vertical stack over the substrate, where the second semiconductor layers have a second spacing that is greater than the first spacing. In an embodiment a second dielectric surrounds each of the second semiconductor layers, and the second dielectric has a second thickness that is greater than the first thickness.

18 Claims, 24 Drawing Sheets

(51) Int. Cl.
  *H01L 27/088* (2006.01)
  *H01L 29/06* (2006.01)
  *H01L 29/423* (2006.01)
  *H01L 29/66* (2006.01)
  *H01L 29/78* (2006.01)
  *B82Y 40/00* (2011.01)

(52) U.S. Cl.
  CPC .. *H01L 29/42392* (2013.01); *H01L 29/66545* (2013.01); *H01L 29/785* (2013.01); *B82Y 40/00* (2013.01)

(56) References Cited

U.S. PATENT DOCUMENTS

| | | | |
|---|---|---|---|
| 2017/0140933 A1 | 5/2017 | Lee | |
| 2018/0114727 A1* | 4/2018 | Rodder | H01L 21/823828 |
| 2019/0252555 A1* | 8/2019 | Liang | H01L 29/78696 |

OTHER PUBLICATIONS

Search Report from European Patent Application No. 20193557.4, mailed Jan. 28, 2021, 12 pages.
Office Action from Taiwan Patent Application No. 109131701, mailed Dec. 28, 2023, 24 pgs.
Office Action from Taiwan Patent Application No. 109131701, mailed Jun. 19, 2024, 23 pgs.

* cited by examiner

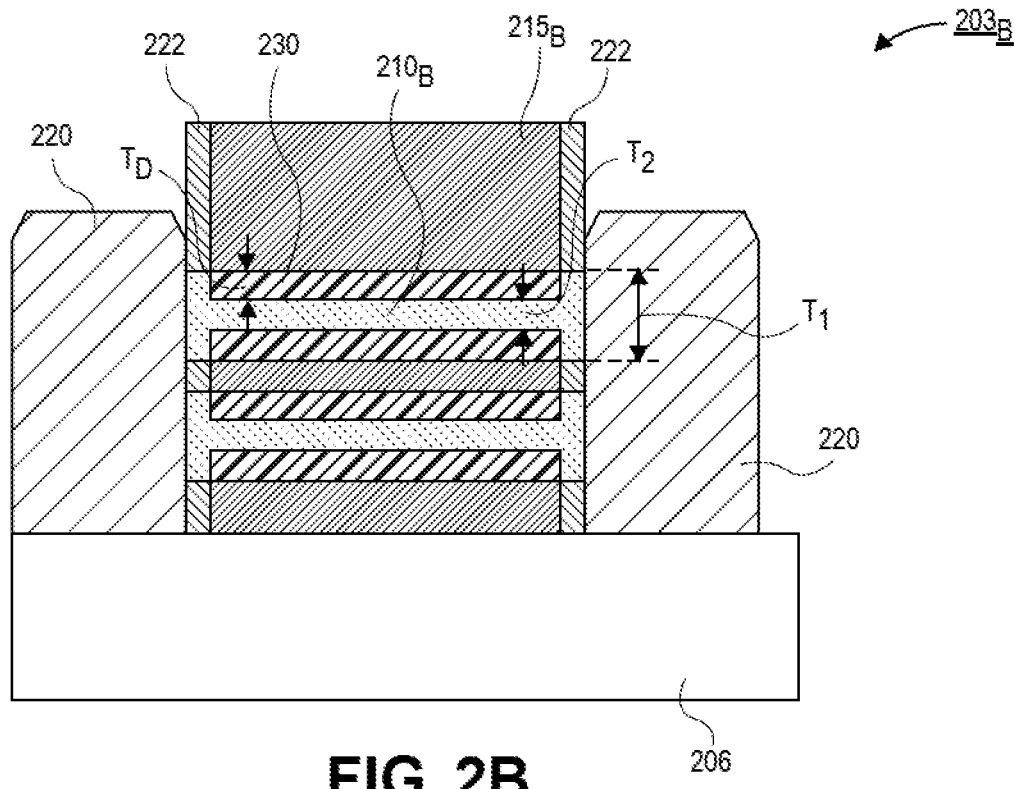
FIG. 2B
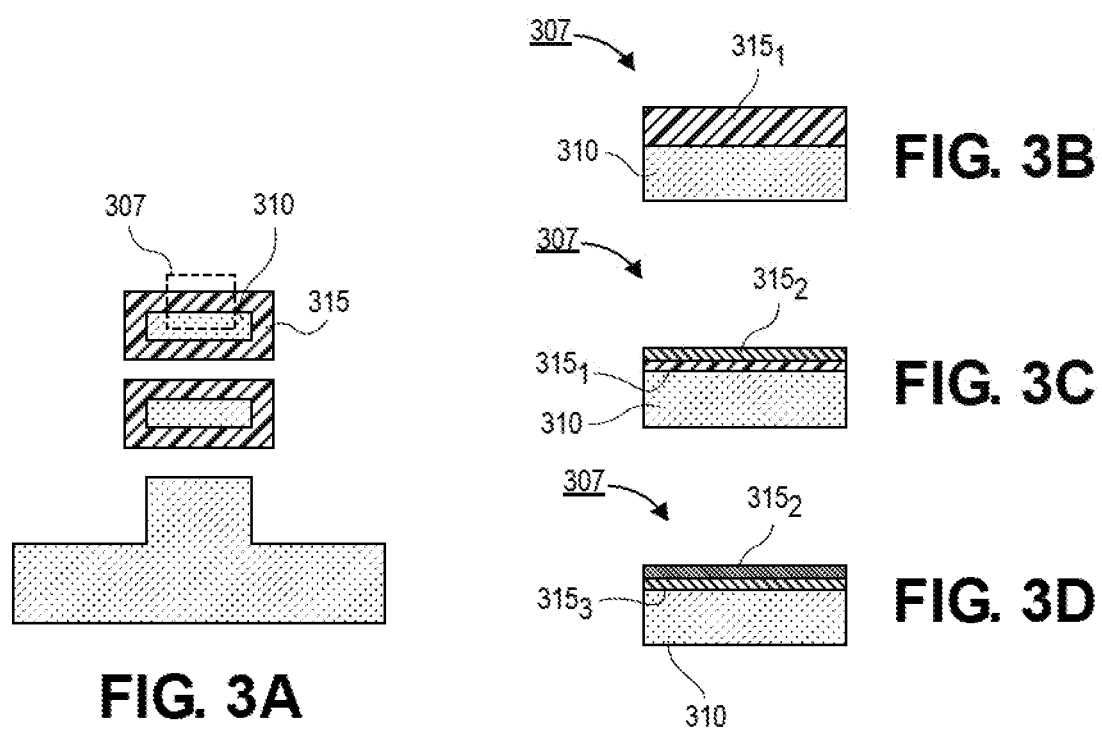
FIG. 3A
FIG. 3B
FIG. 3C
FIG. 3D

NANORIBBON THICK GATE DEVICES WITH DIFFERENTIAL RIBBON SPACING AND WIDTH FOR SOC APPLICATIONS

TECHNICAL FIELD

Embodiments of the present disclosure relate to semiconductor devices, and more particularly to high voltage nanoribbon and nanowire transistors with thick gate dielectrics.

BACKGROUND

As integrated device manufacturers continue to shrink the feature sizes of transistor devices to achieve greater circuit density and higher performance, there is a need to manage transistor drive currents while reducing short-channel effects, parasitic capacitance, and off-state leakage in next-generation devices. Non-planar transistors, such as fin and nanowire-based devices, enable improved control of short channel effects. For example, in nanowire-based transistors the gate stack wraps around the full perimeter of the nanowire, enabling fuller depletion in the channel region, and reducing short-channel effects due to steeper sub-threshold current swing (SS) and smaller drain induced barrier lowering (DIBL).

Different functional blocks within a die may need optimization for different electrical parameters. In some instances high voltage transistors for power applications need to be implemented in conjunction with high speed transistors for logic applications. High voltage transistors typically suffer from high leakage current. Accordingly, high voltage applications typically rely on fin-based transistors. Fin-based transistors allow thicker gate dielectrics compared to nanowire devices. In nanowire devices, a thicker oxide results in the space between nanowires being reduced to the point that little or no gate metal can be disposed between the nanowires.

BRIEF DESCRIPTION OF THE DRAWINGS

FIG. 2B is a cross-sectional illustration of FIG. 2A along line B-B', in accordance with an embodiment.

FIG. 3A is a zoomed in cross-sectional illustration of a nanoribbon surrounded by a gate dielectric layer, in accordance with an embodiment.

FIGS. 3B-3D are cross-sectional illustrations that more clearly depict the structure of the gate dielectric layer, in accordance with an embodiment.

EMBODIMENTS OF THE PRESENT DISCLOSURE

Figure 1A:
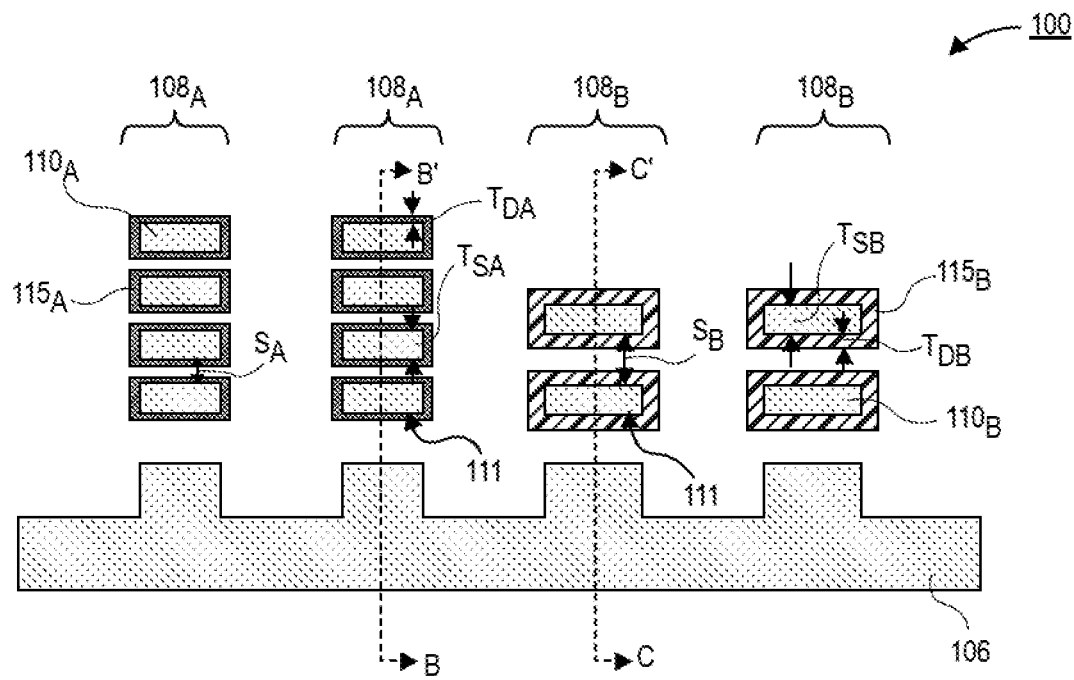
FIG. 1A is a cross-sectional illustration of stacked nanoribbons with variable gate dielectric thicknesses, in accordance with an embodiment.

Described herein are semiconductor devices with high voltage nanoribbon and nanowire transistors with thick gate dielectrics, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, high-voltage transistors are susceptible to high leakage currents. Such transistors are typically implemented with fin-based transistors that allow for thicker gate dielectrics. Fin-based transistors do not provide the same benefits of nanowire devices (e.g., improved short channel effects), and therefore are not an optimal solution. Accordingly, embodiments disclosed herein include nanoribbon (or nanowire) devices with increased gate dielectric thicknesses to reduce leakage. Embodiments disclosed herein provide additional clearance between the nanoribbons to allow the formation of thick gate dielectrics. Such embodiments may also be fabricated in parallel with logic devices that require a smaller spacing between the nanoribbon channels.

In an embodiment, the high-voltage devices may be fabricated in parallel with logic devices by forming a material stack that is segmented into a first region and a second region. In one embodiment, the first region includes semiconductor layers that are spaced at a first spacing, and the second region includes semiconductor layers that are spaced at a second, larger, spacing. The increased spacing in the second region provides clearance for deposition of a thick gate dielectric using an atomic layer deposition (ALD) process. In another embodiment, the first region includes semiconductor layers that have a first thickness, and the second region includes semiconductor layers that have a second, larger, thickness. The increased thickness of the semiconductor layers in the second region provide additional margin for an oxidation process. That is, a portion of the thicker semiconductor layers in the second region is consumed to form a thick gate dielectric.

Nanoribbon devices are described in greater detail below. However, it is to be appreciated that substantially similar devices may be formed with nanowire channels. A nanowire device may include devices where the channel has a width dimension and a thickness dimension that are substantially similar, whereas a nanoribbon device may include a channel that has a width dimension that is substantially larger or substantially smaller than a thickness dimension. As used herein, "high-voltage" may refer to voltages of approximately 1.0V or higher. Particular embodiments may include high-voltage devices that operate at approximately 1.2V or greater.

Referring now to FIG. 1A, a cross-sectional illustration of an electronic device 100 is shown, in accordance with an embodiment. In an embodiment, the electronic device 100 is formed on a substrate 106. The substrate 106 may include a semiconductor substrate and an isolation layer over the semiconductor substrate. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The substrate 106 may also comprise an insulating material (e.g., an oxide or the like) that provides isolation between neighboring transistor devices.

In FIG. 1A, a cross-sectional illustration of a plurality of processed fins 108 are shown. That is, the residual nanoribbons 110 are shown following the removal of sacrificial layers (not shown) between the nanoribbons 110. For example, the cross-sectional illustration in FIG. 1A may be representative of a cross-section through a channel region of nanoribbon transistors, with the gate electrode removed. The nanoribbons 110 may comprise any suitable semiconductor materials. For example, the nanoribbons 110 may comprise silicon or III-V group materials.

In an embodiment, the first nanoribbons $110_A$ may have dimensions that are substantially similar to the second nanoribbons $110_B$. For example, the first nanoribbons $110_A$ may have a thickness $T_{SA}$ and the second nanoribbons $110_B$ may have a thickness $T_{SB}$ that is substantially similar to the thickness $T_{SA}$. The widths of the first nanoribbons $110_A$ and $110_B$ may be similar to each other in some embodiments.

In an embodiment, first fins $108_A$ may be used for logic devices, and second fins $108_B$ may be used for high-voltage devices. In order to provide optimal performance, a thickness $T_{DA}$ of the dielectric $115_A$ around the nanoribbons $110_A$ may be less than a thickness $T_{DB}$ of the dielectric $115_B$ around the nanoribbons $110_B$. The dielectric $115_A$ may have a thickness $T_{DA}$ that is approximately 3 nm or less, and the dielectric $115_B$ may have a thickness $T_{DB}$ that is approximately 3 nm or greater. In a particular embodiment, the thickness $T_{DB}$ may be approximately 6 nm or greater.

As noted above, the larger thickness of the dielectric $115_B$ will lead to pinching off or otherwise preventing the gaps between the nanoribbons 110 from being filled with gate metal. For example, the spacing $S_A$ between nanoribbons in the first fins $108_A$ may be representative of a typical spacing for nanoribbon logic devices (e.g., between approximately 3 nm and approximately 8 nm). As such, the thick dielectrics $115_B$ will merge when such a spacing is used. In order to accommodate the dielectric $115_B$, the second fins $108_B$ comprise nanoribbons $110_B$ that have a spacing $S_B$ that is greater than the spacing $S_A$. The spacing $S_B$ may be 8 nm or greater, or 12 nm or greater. In some embodiments, the spacing $S_B$ may be an integer multiple of the thickness $T_{SA}$ of the first nanoribbons $110_A$. In a particular embodiment, the spacing $S_B$ may be twice the thickness $T_{SA}$ of the first nanoribbons $110_A$.

In an embodiment, a bottommost first nanoribbon $110_A$ in a first fin $108_A$ is aligned with a bottommost second nanoribbon $110_B$ in a second fin $108_B$. For example, the bottom surfaces 111 (i.e., the surfaces facing toward the substrate 106) may be substantially coplanar with each other. In an embodiment, one or more of the second nanoribbons $110_B$ in a second fin $108_B$ may be misaligned from first nanoribbons $110_A$ in a first fin $108_A$. For example, the topmost second nanoribbon $110_B$ in a second fin $108_B$ is positioned (in the Z-direction) between first nanoribbons $110_A$ in a first fin $108_A$.

In the illustrated embodiment, a number of first nanoribbons $110_A$ in a first fin $108_A$ may be different than a number of second nanoribbons $110_B$ in a second fin $108_B$. For example, the number of first nanoribbons $110_A$ in each first fin $108_A$ is greater than the number of second nanoribbons $110_B$ in each second fin $108_B$. In a particular embodiment, the number of first nanoribbons $110_A$ in each first fin $108_A$ is an integer multiple (e.g., 2×, 3×, etc.) of the number of second nanoribbons $110_B$ in each second fin $108_B$. For example, FIG. 1A illustrates four first nanoribbons $110_A$ in each first fin $108_A$ and two second nanoribbons $110_B$ in each second fin $108_B$.

Figure 1B:
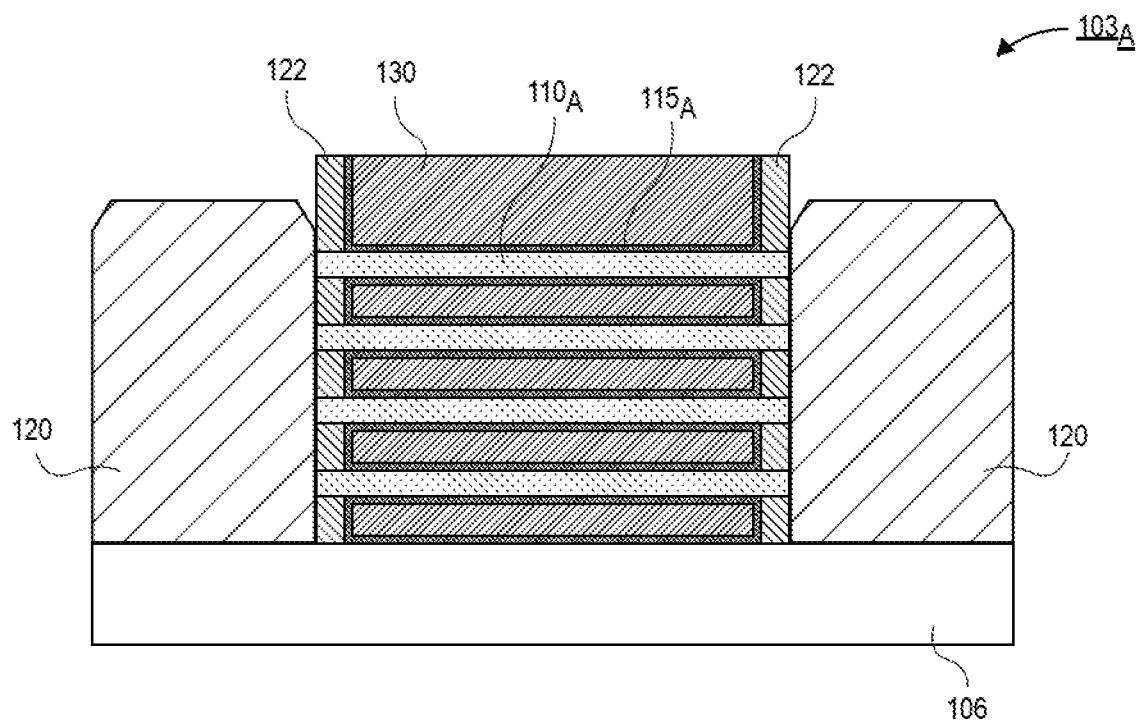
FIG. 1B is a cross-sectional illustration of FIG. 1A along line B-B', in accordance with an embodiment.
Figure 1C:
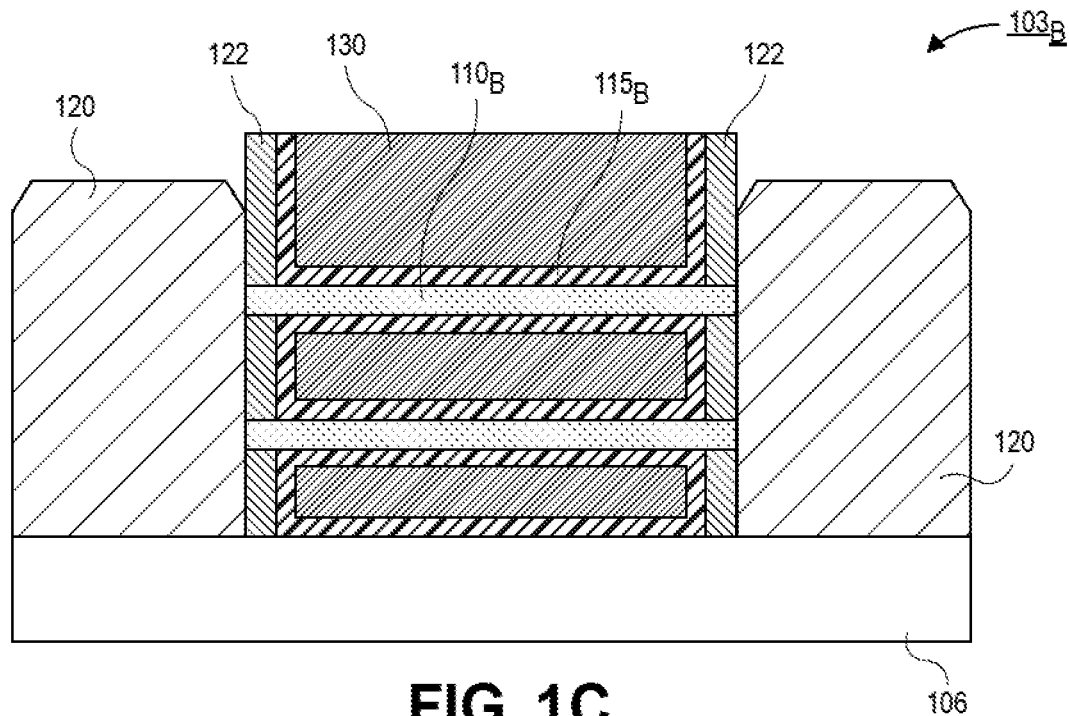
FIG. 1C is a cross-sectional illustration of FIG. 1A along line C-C', in accordance with an embodiment.

Referring now to FIGS. 1B and 1C, cross-sectional illustrations of FIG. 1A along line B-B' and C-C' are shown, respectively, in accordance with an embodiment. FIGS. 1B and 1C include more detail than FIG. 1A. Particularly, FIGS. 1B and 1C provide an illustration of transistor devices $103_A$ and $103_B$, respectively, that are formed along the fins $108_A$ and $108_B$.

Referring now to FIG. 1B, a cross-sectional illustration of a first nanoribbon transistor $103_A$ is shown, in accordance with an embodiment. The nanoribbon transistor $103_A$ may comprise a vertical stack of nanoribbons $110_A$. The nanoribbons $110_A$ extend between source/drain regions 120. A gate structure may define a channel region of the transistor $103_A$. The gate structure may comprise a gate dielectric $115_A$ and a gate electrode 130. The gate dielectric $115_A$ may surround the nanoribbons $110_A$ and line the spacers 122 on either side of the gate electrode 130. In an embodiment, the gate electrode 130 surrounds the nanoribbons $110_A$ to provide gate all around (GAA) control of the transistor $103_A$. In an embodiment, the first nanoribbon transistor $103_A$ is used as part of a logic block. Accordingly, the first nanoribbon transistor $103_A$ is optimized for fast switching speeds, and may have a substantially thin gate dielectric $115_A$.

In an embodiment, the source/drain regions 120 may comprise an epitaxially grown semiconductor material. The source/drain regions 120 may comprise a silicon alloy. In some implementations, the source/drain regions 120 comprise a silicon alloy that may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In other embodiments, the source/drain regions 120 may comprise alternative semiconductor materials (e.g., semiconductors comprising group III-V elements and alloys thereof) or conductive materials.

In an embodiment, the gate dielectric $115_A$ may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

In an embodiment, the gate electrode 130 may comprise a work function metal. For example, when the metal gate electrode 130 will serve as an N-type workfunction metal, the gate electrode 130 preferably has a workfunction that is between about 3.9 eV and about 4.2 eV. N-type materials that may be used to form the metal gate electrode 130 include, but are not limited to, hafnium, zirconium, titanium, tantalum, aluminum, and metal carbides that include these elements, e.g., titanium carbide, zirconium carbide, tantalum carbide, hafnium carbide and aluminum carbide. Alternatively, when the metal gate electrode 130 will serve as a P-type workfunction metal, the gate electrode 130 preferable has a workfunction that is between about 4.9 eV and about 5.2 eV. P-type materials that may be used to form the metal gate electrode 130 include, but are not limited to, ruthenium, palladium, platinum, cobalt, nickel, and conductive metal oxides, e.g., ruthenium oxide. The gate electrode 130 may also comprise a workfunction metal and a fill metal (e.g., tungsten) over the workfunction metal.

Referring now to FIG. 1C, a cross-sectional illustration of a second transistor $103_B$ is shown, in accordance with an embodiment. In an embodiment, the second transistor $103_B$ may be similar to the first transistor $103_A$, with the exception that fewer nanoribbons $110_B$ are included and the thickness of the gate dielectric $115_B$ is increased. In an embodiment, the thicker gate dielectric $115_B$ allows for higher voltage operation of the second transistor $103_B$ compared to the first transistor $103_A$.

Figure 2A:
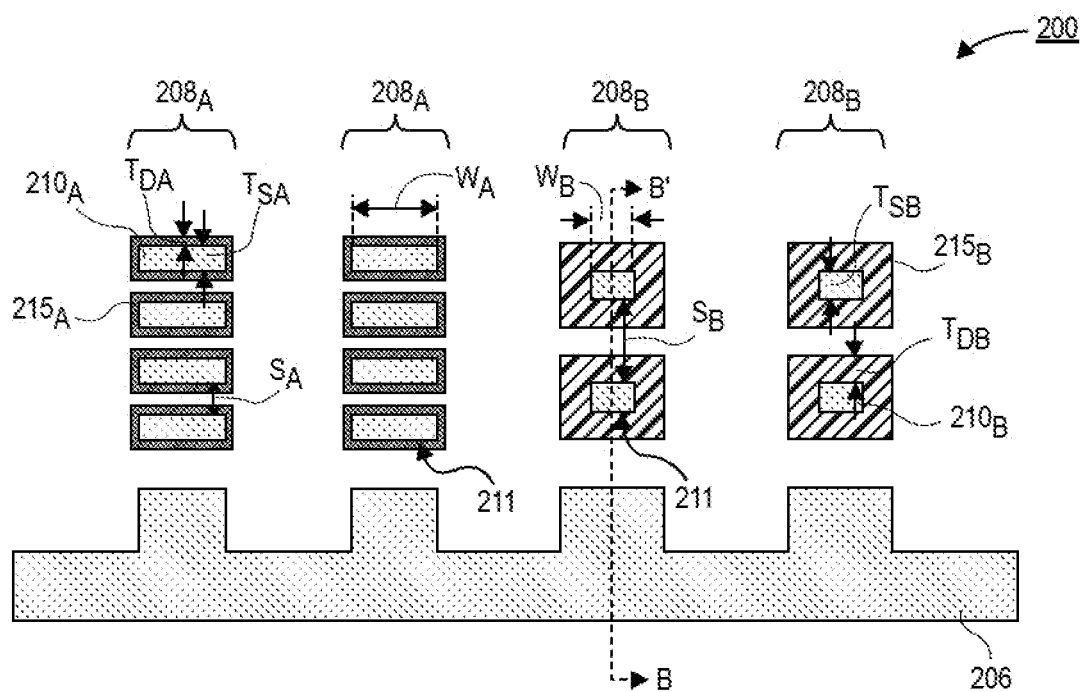
FIG. 2A is a cross-sectional illustration of stacked nanoribbons with variable gate dielectric thicknesses, in accordance with an additional embodiment.

Referring now to FIG. 2A, a cross-sectional illustration of a plurality of processed fins 208 are shown, in accordance with an embodiment. The processed fins 208 may each comprise a vertical stack of nanoribbons 210 over a substrate 206. In an embodiment, first fins $208_A$ are suitable for high speed applications (e.g., logic devices), and second fins $208_B$ are suitable for high voltage applications. In an embodiment, the first fins $208_A$ may be substantially similar to the first fins $108_A$ in FIG. 1A. That is, the first fins $208_A$ may comprise first nanoribbons $210_A$ and first dielectrics $215_A$ surrounding the first nanoribbons $210_A$.

In an embodiment, the second fins $208_B$ in FIG. 2A have a different structure than the second fins $108_B$ in FIG. 1A. The different structure, is attributable, at least in part, due to the method used to form the dielectrics $215_B$. For example, the second fins $108_B$ include dielectrics $115_B$ that are deposited using ALD, whereas the second fins $208_B$ include dielectrics $215_B$ that are formed with an oxidization process. Particularly, the second fins $208_B$ may have nanoribbons $210_B$ that are originally larger than the nanoribbons $210_A$ of the first fins $208_A$, and which are partially converted into the dielectric $215_B$ by an oxidation process. The oxidation process provides dielectric $215_B$ with a thickness $T_{DB}$ that is greater than the thickness $T_{DA}$ of the dielectric $215_A$.

The conversion of portions of the second nanoribbons $210_B$ results in the spacing $S_B$ being larger than the spacing $S_A$ in first nanoribbons $210_A$. In some embodiments, the second nanoribbons $210_B$ may have a thickness $T_{SB}$. The thickness $T_{SB}$ may be similar to the thickness $T_{SA}$ of the first nanoribbons $210_A$. In other embodiments, the thickness $T_{SB}$ may be different than the thickness $T_{SA}$ of the first nanoribbons $210_A$. In an embodiment, the oxidation process may also shrink the width $W_B$ of the second nanoribbons $210_B$. For example, the width $W_B$ of the second nanoribbons $210_B$ may be smaller than a width $W_A$ of the first nanoribbons $210_A$. However, in other embodiments, the second fins $208_B$ are originally formed with a larger width, and the oxidation process may result in the second nanoribbons $210_B$ having a width $W_B$ that is substantially similar to the width $W_A$ of the first nanoribbons $210_A$.

Embodiments also includes second fins $208_B$ that have second nanoribbons $210_B$ that are not aligned with the first nanoribbons $210_A$ of the first fins $208_A$. For example, the bottom surface 211 (i.e., the surface facing the substrate 206) of the bottommost second nanoribbon $210_B$ is not aligned with a bottom surface 211 (i.e., the surface facing the substrate 206) of the bottommost first nanoribbon $210_A$.

Referring now to FIG. 2B, a cross-sectional illustration of the semiconductor device 200 in FIG. 2A along line B-B' is shown, in accordance with an embodiment. FIG. 2B includes more detail than FIG. 2A. Particularly, FIG. 2B provides an illustration of a transistor device $203_B$ that is formed along a second fin $208_B$. The transistor device along a first fin $208_A$ would have a cross-section substantially similar to the transistor device $103_A$ in FIG. 1B, and is therefore not repeated here.

Referring now to FIG. 2B, a cross-sectional illustration of a second nanoribbon transistor $203_B$ is shown, in accordance with an embodiment. The second nanoribbon transistor $203_B$ comprises source/drain regions 220 on opposite ends of a gate structure. The gate structure may comprise a gate electrode 230 and spacers 222 between the source/drain regions 220 and the gate electrode 230.

In an embodiment, the nanoribbons $210_B$ may have a non-uniform thickness. For example, the nanoribbons $210_B$ may have a first thickness $T_1$ in the portions passing through the spacers 222 and a second thickness $T_2$ in the channel region (i.e., the portion surrounded by the gate electrode 230). The second thickness $T_2$ is larger than the first thickness $T_1$ and is the original thickness of the nanoribbon prior to the oxidation process. As such, the second thickness $T_2$ plus twice the thickness $T_D$ (i.e., above and below the nanoribbon $210_B$) may be substantially equal to the first thickness $T_1$. In an embodiment, since the dielectric $215_B$ is disposed with an oxidation process, the spacers 222 may also be free from the dielectric $215_B$. As such, the spacers 222 may be in direct contact with the gate electrode 230 in some embodiments.

Referring now to FIG. 3A, an isolated cross-sectional illustration of nanoribbons 310 is shown, in accordance with an embodiment. In an embodiment, the nanoribbons 310 may comprise a dielectric 315 that surrounds the nanoribbon 310. Embodiments disclosed herein include various configurations and material choices for the dielectric 315 in order to provide voltage threshold (VT) and maximum voltage (VMAX) modulation in order to improve the performance of the high-voltage nanowire transistors. Particularly, various dielectric 315 configurations disclosed herein allow for the VT and VMAX to be tuned while using a single workfunction metal for different gate electrodes. Additionally, the various dielectric 315 configurations may allow for higher dielectric constants (k), which can lessen the need for thicker dielectrics 315. A zoomed in illustration of a portion 307 is shown in FIGS. 3B-3D in accordance with various embodiments.

Referring now to FIG. 3B, a cross-sectional illustration of portion 307 is shown, in accordance with an embodiment. In an embodiment, the portion 307 comprises a first dielectric $315_1$ that is in direct contact with the nanoribbon 310. In an embodiment, the first dielectric 315 comprises $SiO_2$. That is, the dielectric 315 may be a single material layer. In an embodiment, the first dielectric $315_1$ may be formed with an ALD process or an oxidation process.

In some embodiments, the first dielectric $315_1$ may also be subject to an annealing process. Controlling the time and temperatures of the anneal allow for VT variation of the device. For example, an anneal may move the VT of the N-type device and the P-type device in the same or opposite directions. In an embodiment, the anneal may be implemented in an $NH_3$ environment. Accordingly, an excess of nitrogen is detectable in the resulting first dielectric $315_1$. For example, analysis techniques such as, XSEM, TEM, or SIMS may be used to detect the presence of nitrogen in the first dielectric $315_1$ in order to verify that such an annealing process was used to modify the first dielectric $315_1$.

Referring now to FIG. 3C, a cross-sectional illustration of portion 307 is shown, in accordance with an embodiment. In an embodiment, the portion 307 comprises a first dielectric $315_1$ that is in direct contact with the nanoribbon 310 and a second dielectric $315_2$ that is over the first dielectric $315_1$. In an embodiment, the first dielectric $315_1$ may be $SiO_2$, and the second dielectric $315_2$ may be a dipole material. In an embodiment, the first dielectric $315_1$ can be formed with an ALD process or an oxidation process. The use of a dipole material provides a layer with a significantly higher dielectric constant (k) than the first dielectric $315_1$. For example, $SiO_2$ may have a dielectric constant (k) of 3.9, and the second dielectric $315_2$ may have a dielectric constant (k) of 10 or higher. Dipole materials for the second dielectric $315_2$ may include, but are not limited to, $La_2O_3$, $ZrO_2$, $Y_2O_3$, and $TiO_2$. In an embodiment, one or both of the first dielectric $315_1$ and the second dielectric $315_2$ may be subject to an annealing process in order to modulate the VT.

Referring now to FIG. 3D, a cross-sectional illustration of portion 307 is shown, in accordance with an embodiment. In an embodiment, the portion 307 comprises a third dielectric $315_3$ that is in direct contact with the nanoribbon 310 and a second dielectric $315_2$ that is over the third dielectric $315_3$. In an embodiment, the third dielectric $315_3$ may be dielectrics other than $SiO_2$ that are known to have good interfacial properties over silicon and which have a higher dielectric constant (k) than $SiO_2$. For example, the third dielectric $315_3$ may comprise $HfO_2$. In an embodiment, the third dielectric $315_3$ may be deposited with an ALD process or the like. In an embodiment, the second dielectric $315_2$ may be a dipole material, similar to those described above with respect to FIG. 3C. In an embodiment, one or both of the third dielectric $315_3$ and the second dielectric $315_2$ may be subject to an annealing process in order to modulate the VT.

In FIGS. 3C and 3D, the first dielectric $315_1$ and the third dielectric $315_3$ provide a buffer between the nanoribbon 310 and the second dielectric $315_2$. That is, materials with known good reliability at the interface with the nanoribbon 310 are provided. The high-k dipole materials of the second dielectric $315_2$ can then be deposited without having concern for reliability issues that may arise when the second dielectric $315_2$ is formed directly over the nanoribbon 310. However, it is to be appreciated that the stacking order of the dielectrics 315 may be in any order to while still providing substantially similar functionality.

Figure 4A:
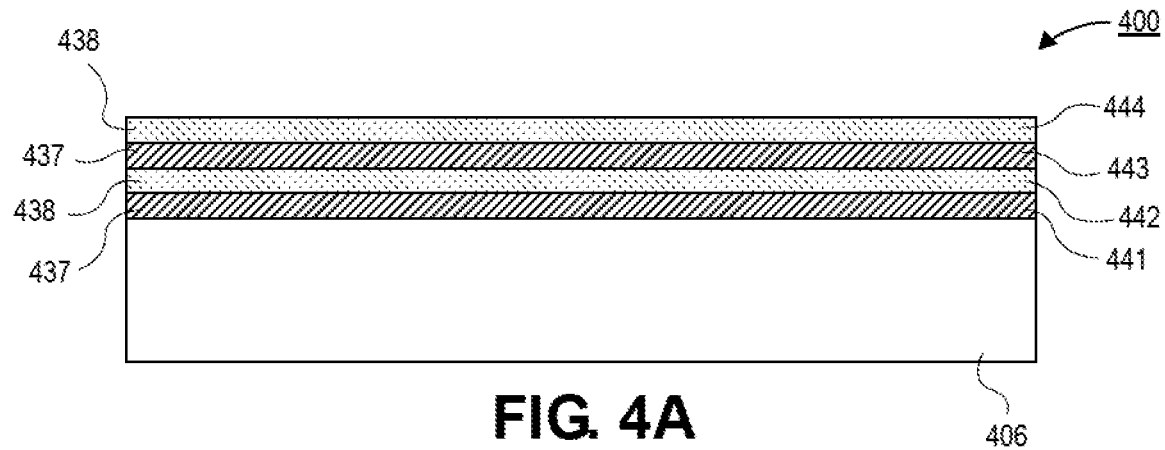
FIGS. 4A-4P are cross-sectional illustrations depicting a process to form nanoribbon transistors with non-uniform gate dielectric thicknesses, where the gate dielectric is disposed with an atomic layer deposition (ALD) process, in accordance with an embodiment.
Figure 4B:
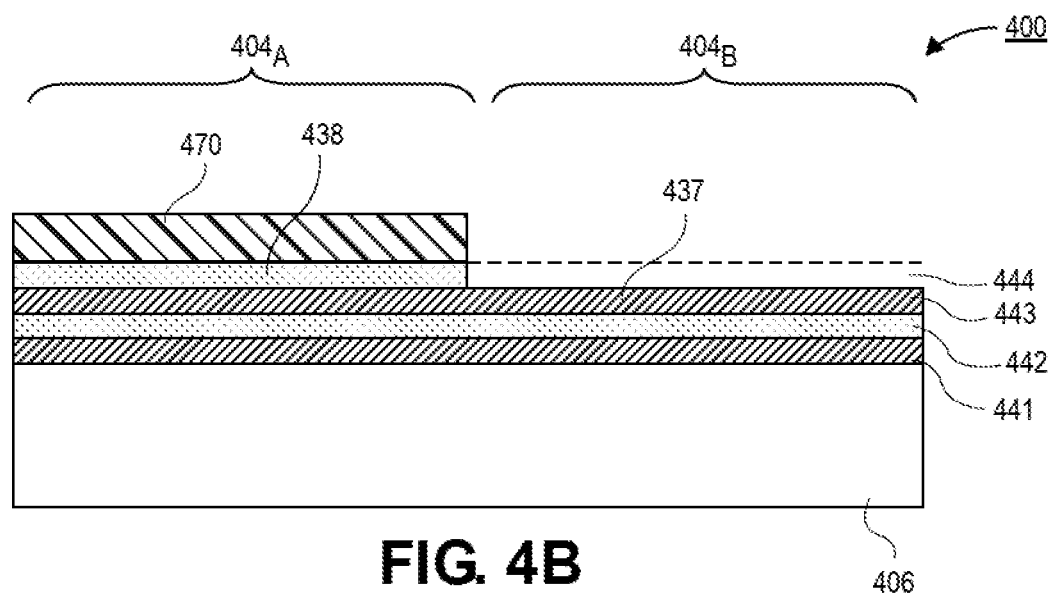
Figure 4C:
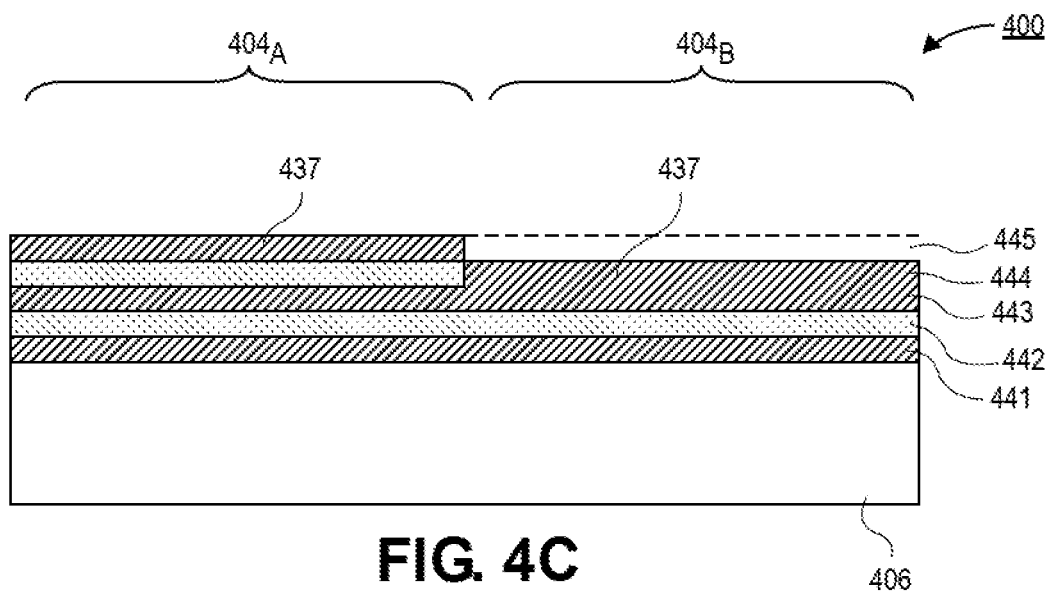
Figure 4D:
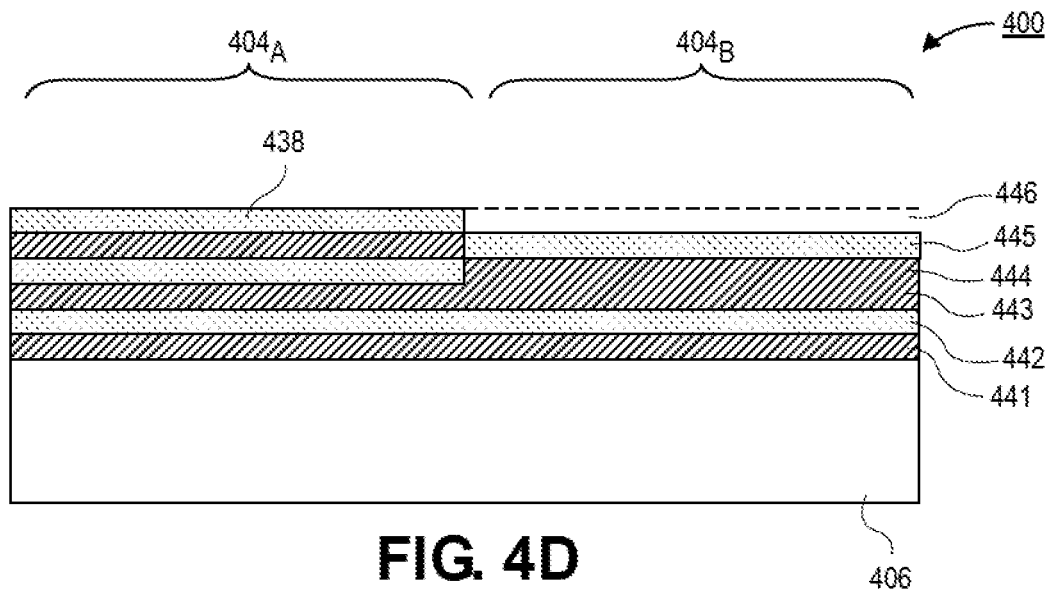
Figure 4E:
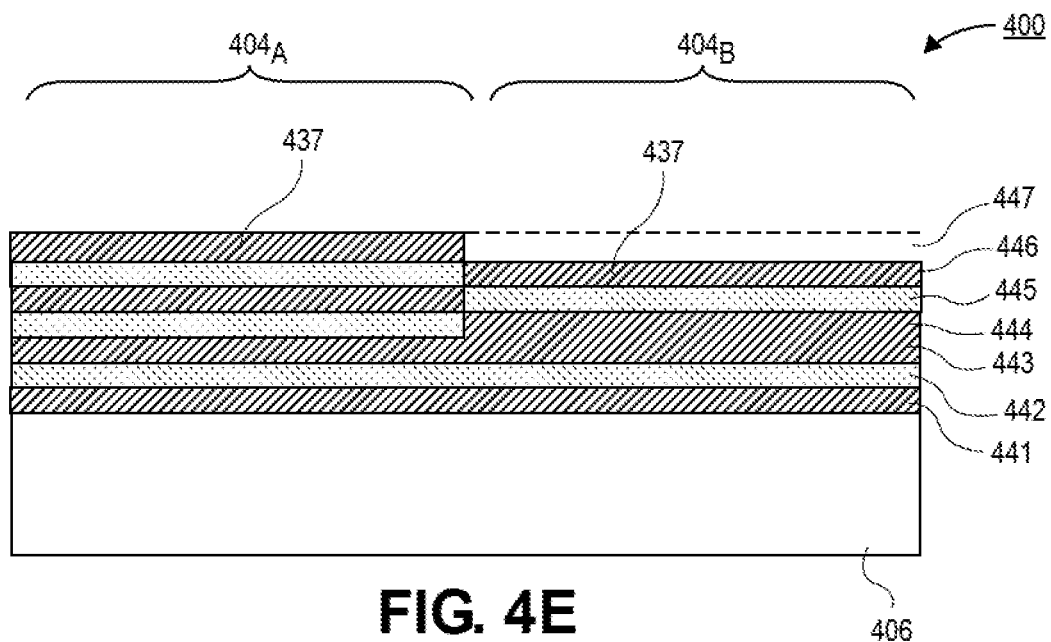
Figure 4F:
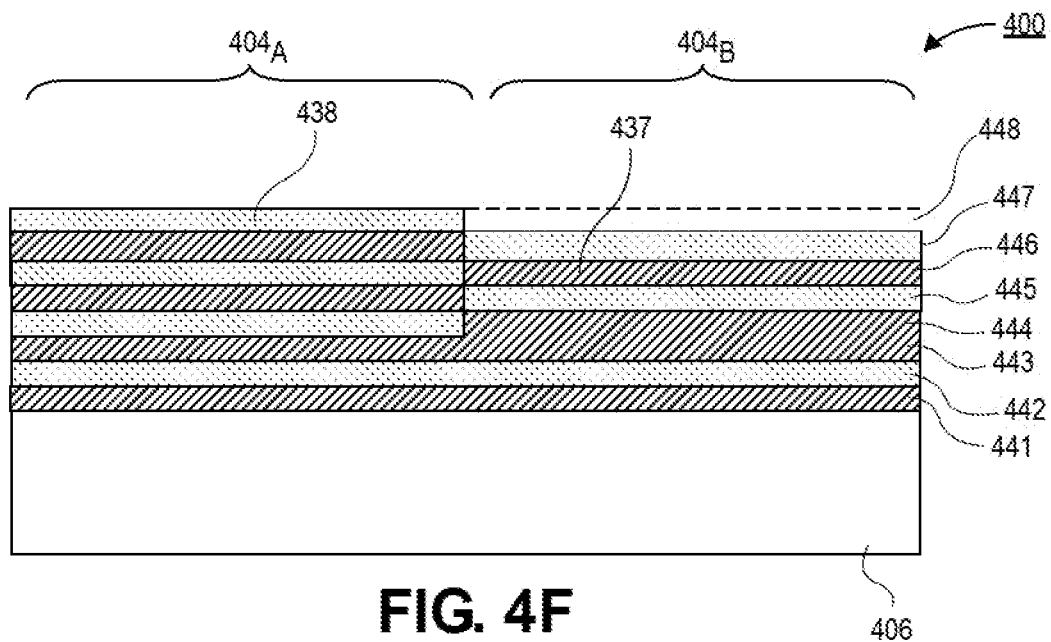
Figure 4G:
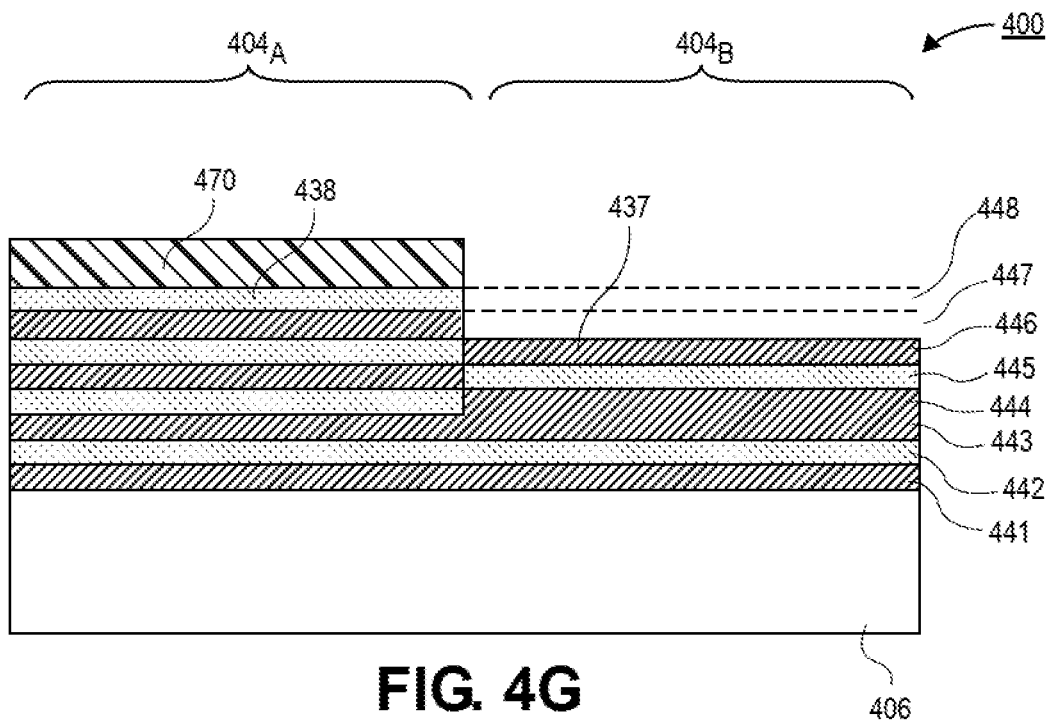
Figure 4H:
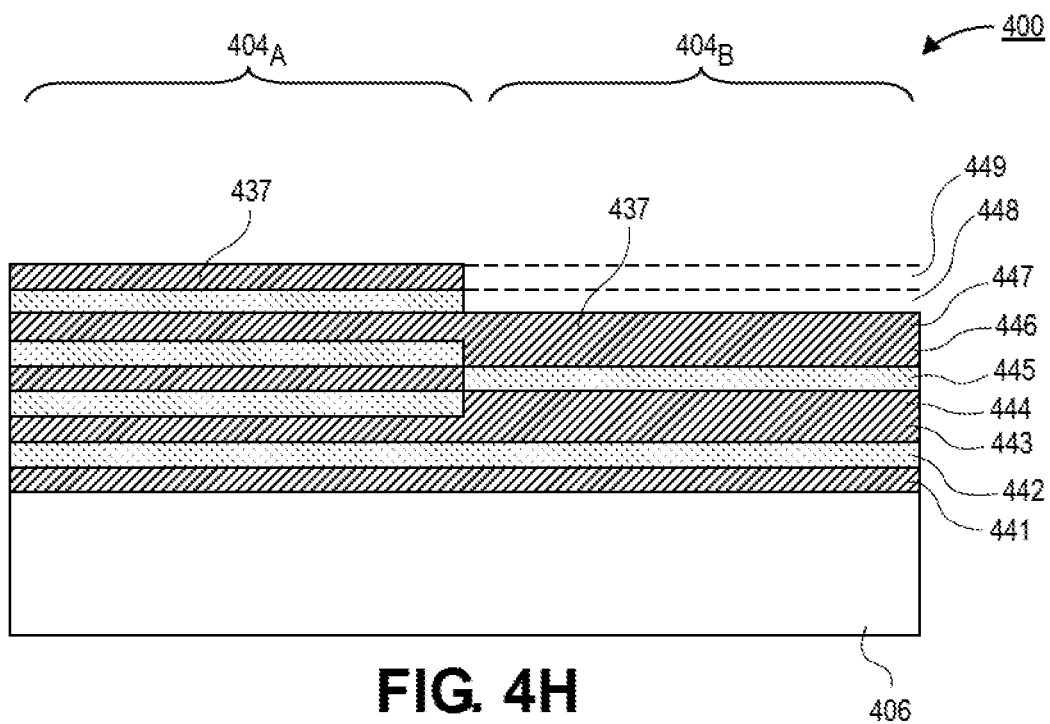
Figure 4I:
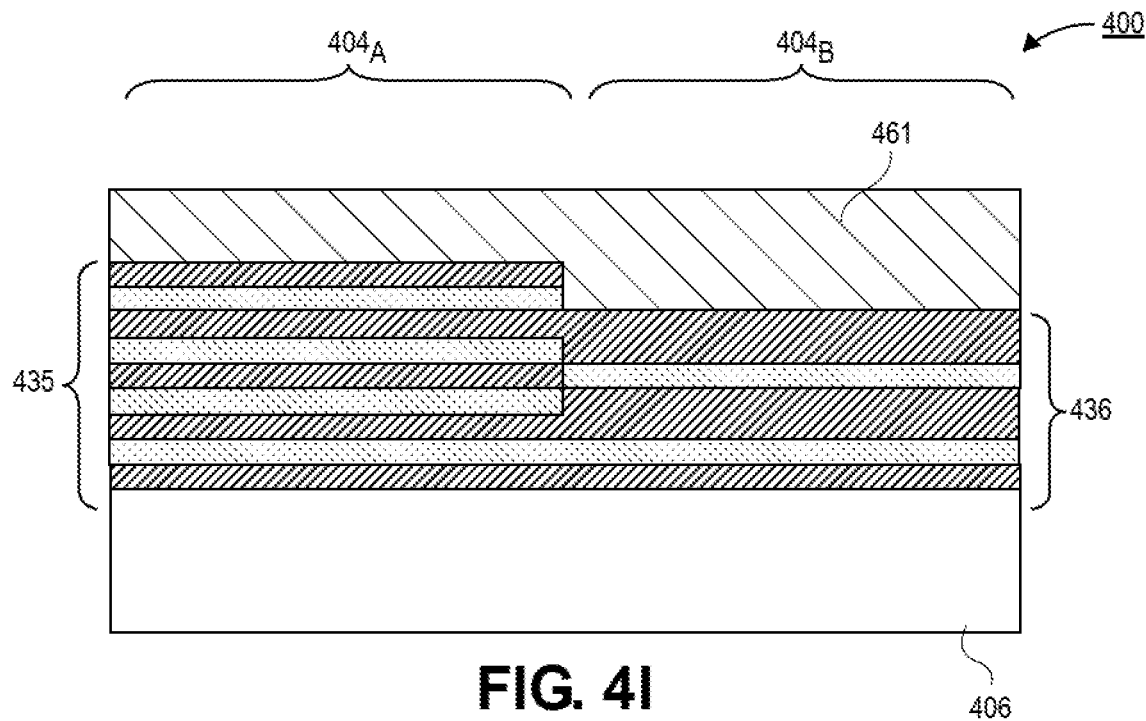
Figure 4J:
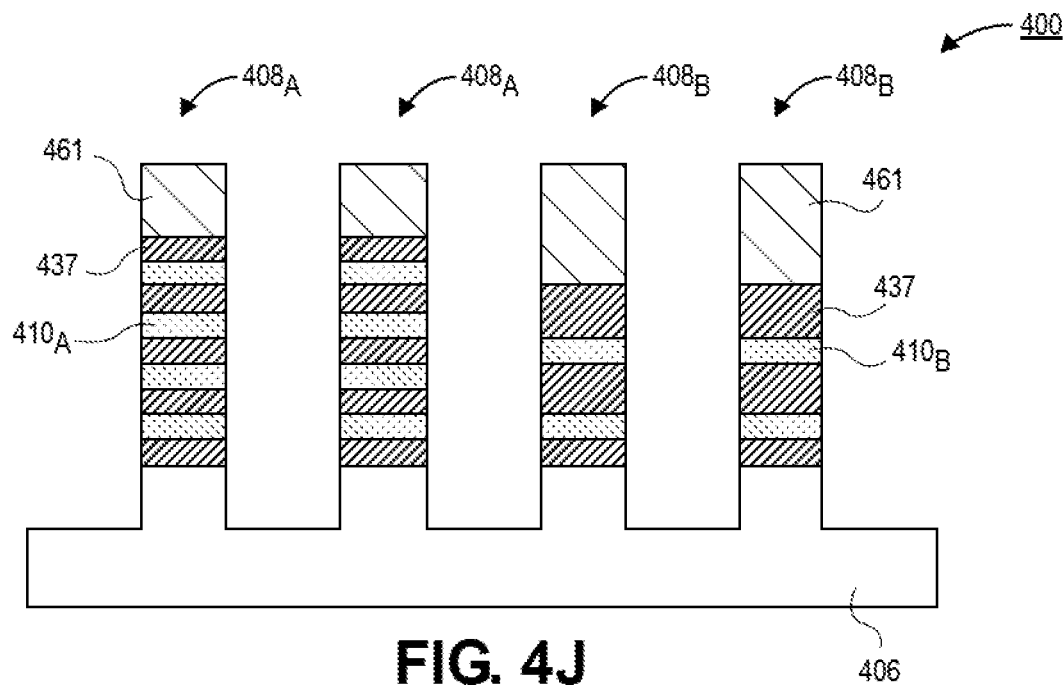
Figure 4K:
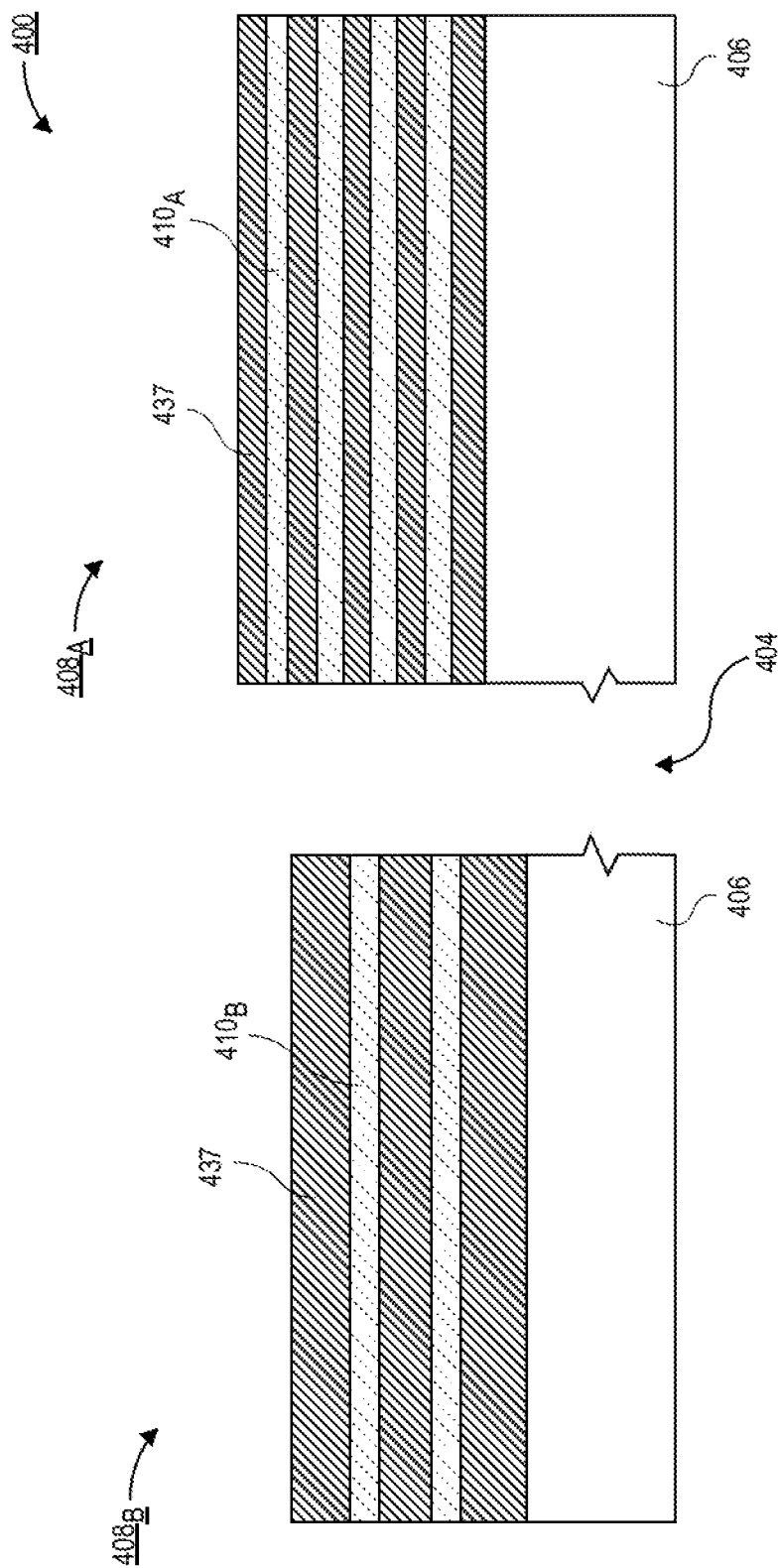
Figure 4L:
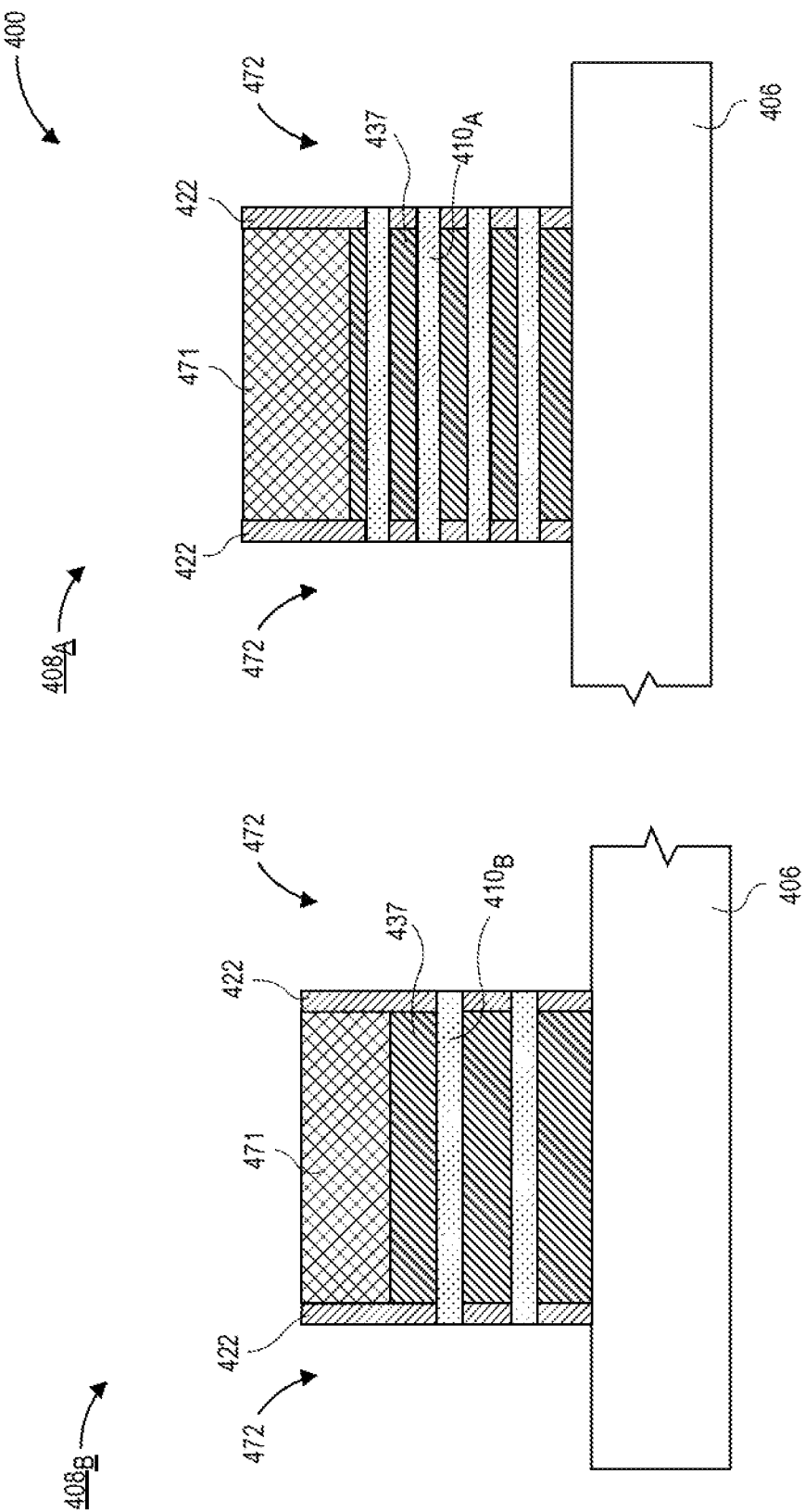
Figure 4M:
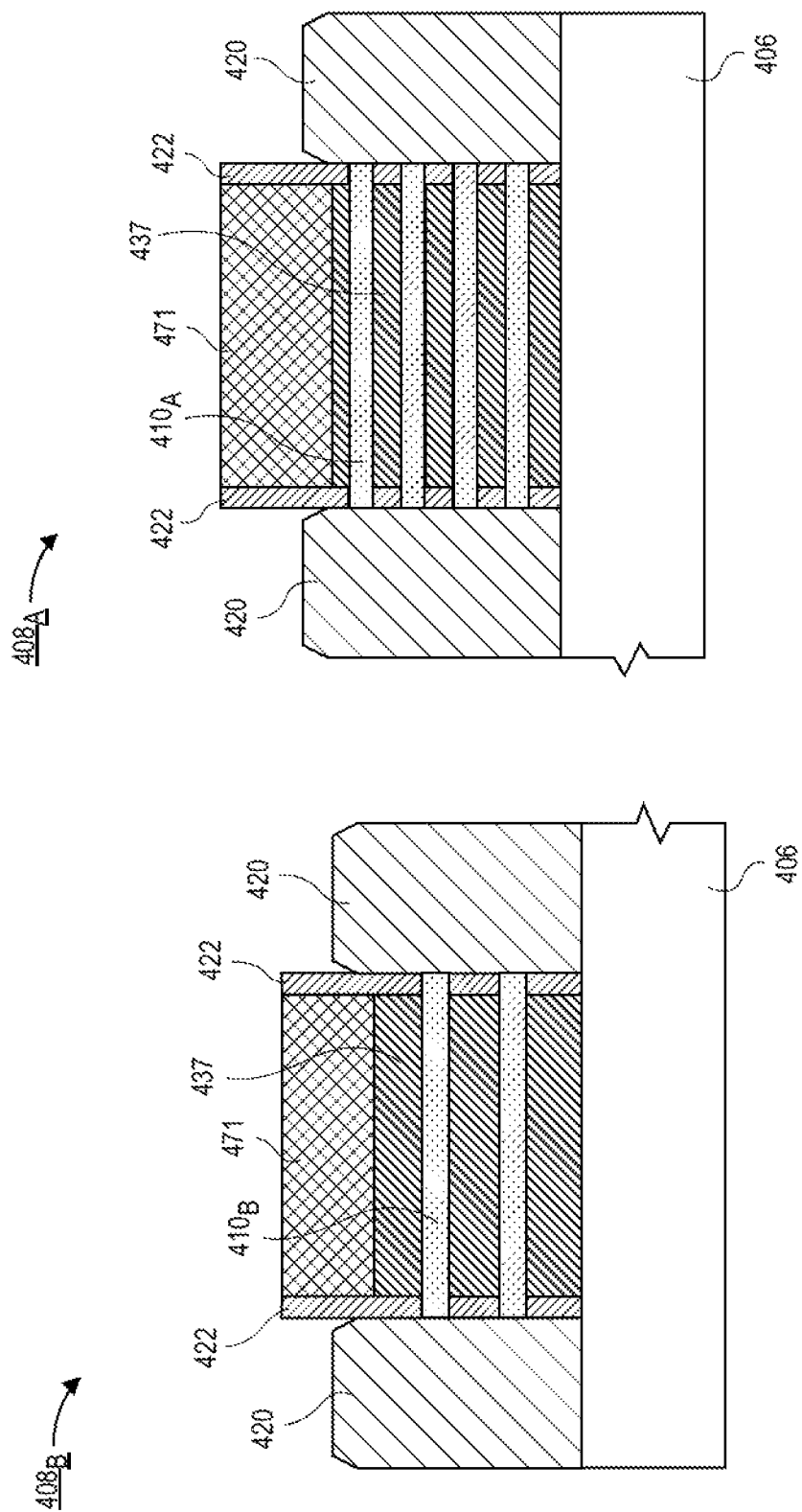
Figure 4N:
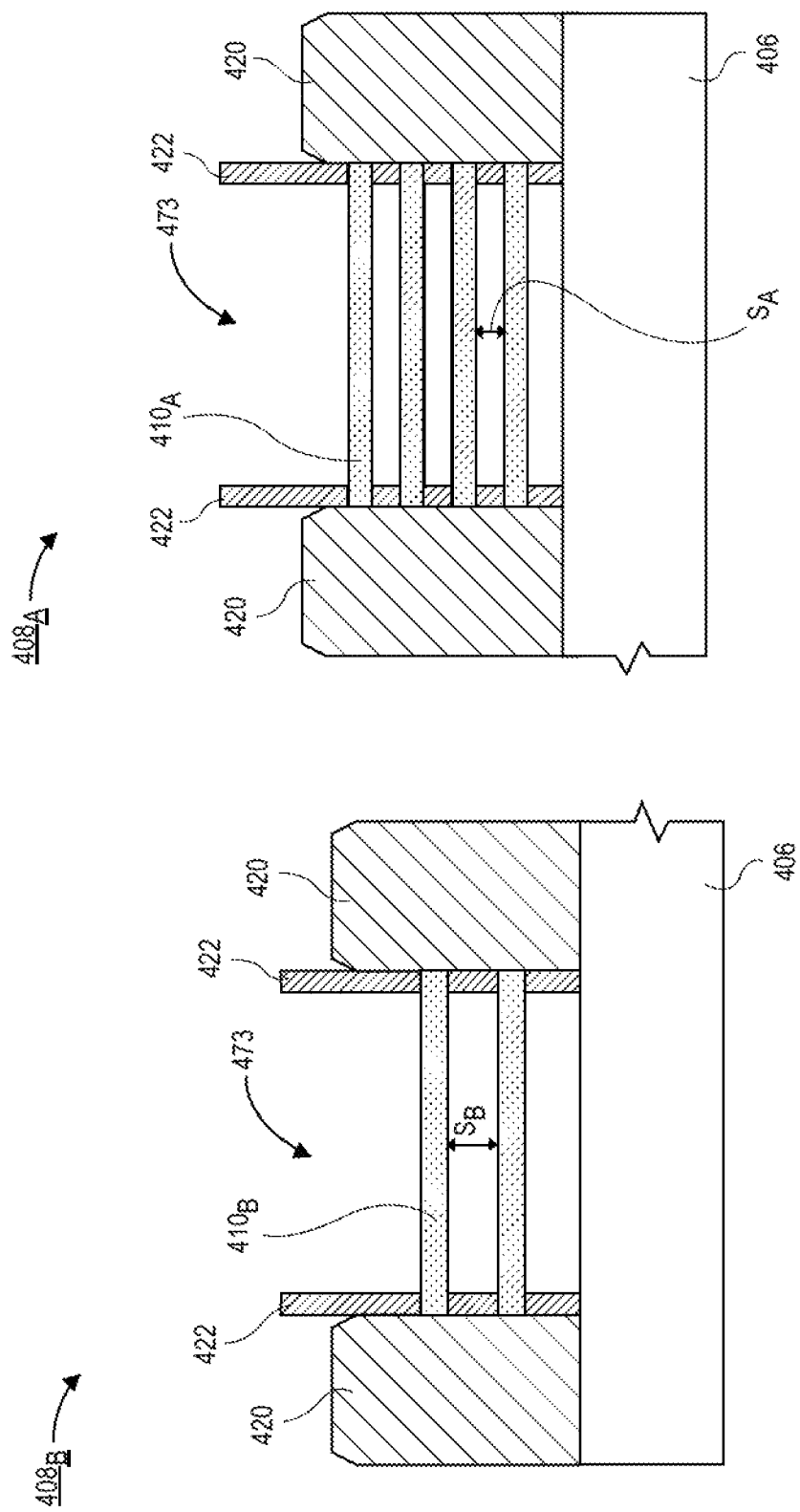
Figure 4O:
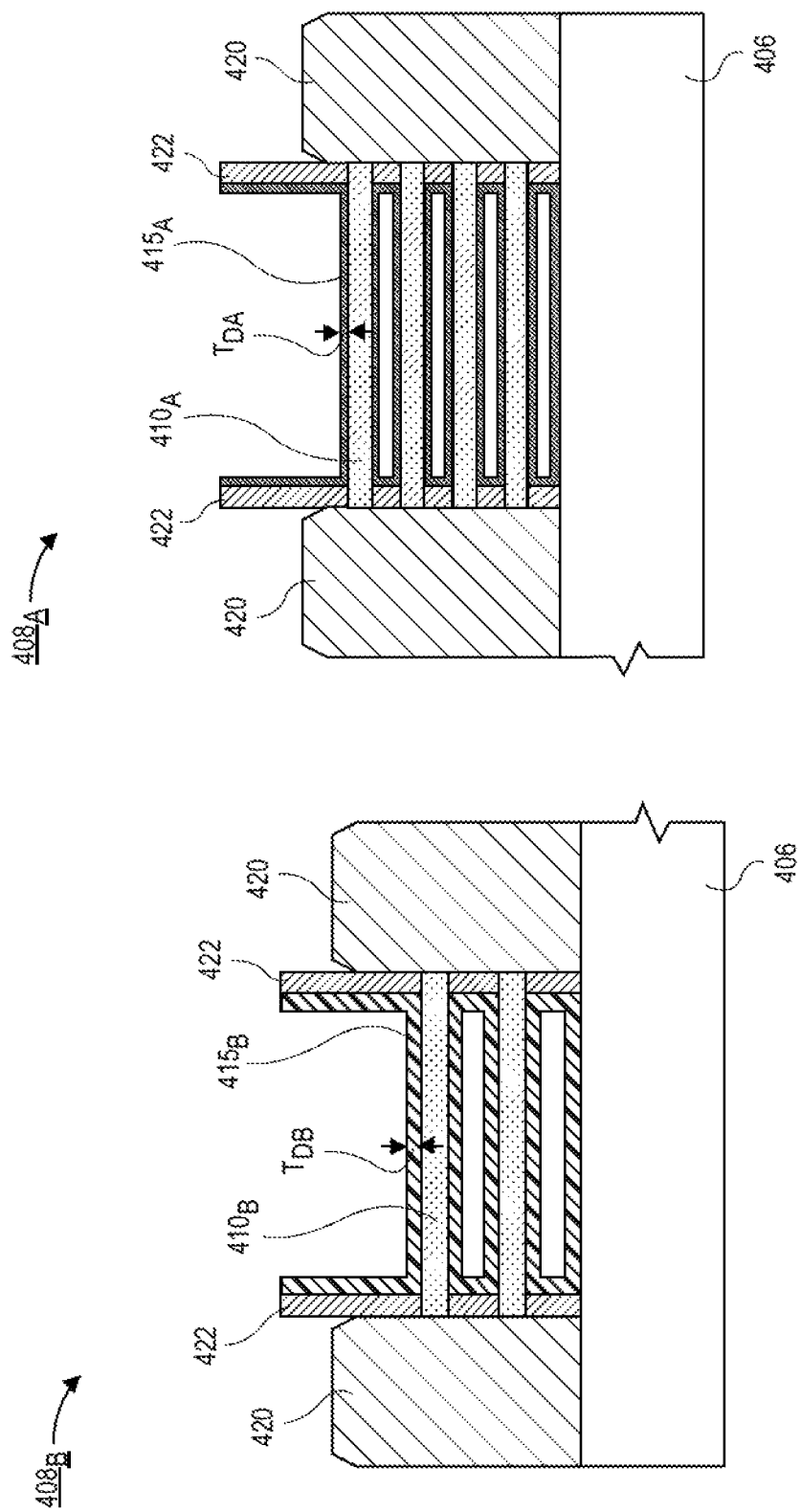
Figure 4P:
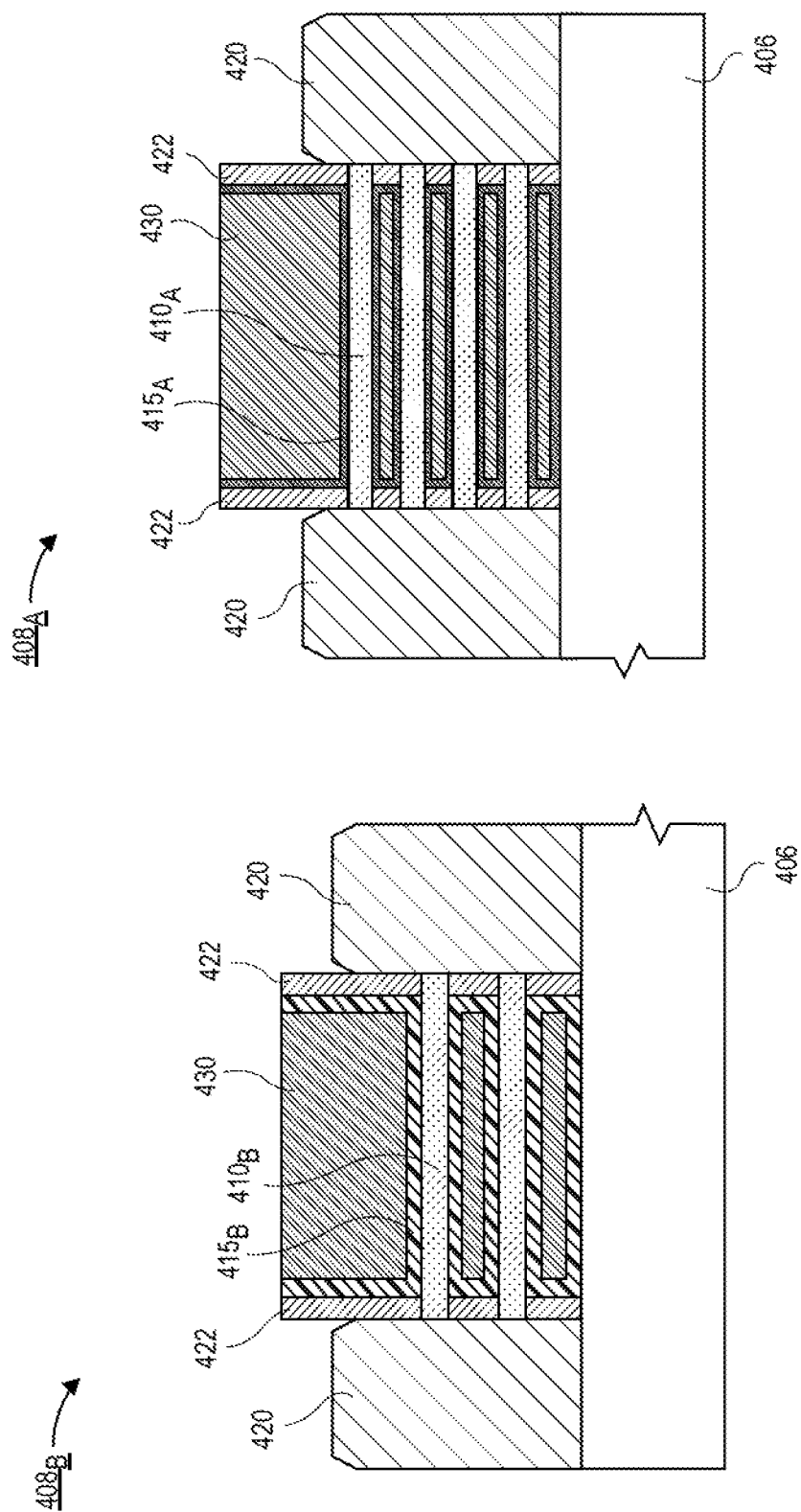

Referring now to FIGS. 4A-4P, a series of cross-sectional illustrations depicting a process for forming a pair of nanoribbon transistors with different gate dielectric thicknesses is shown, in accordance with an embodiment. The process illustrated includes the use of an ALD process to deposit the gate dielectric. Accordingly, the spacing between nanoribbons of the transistor with a thick gate dielectric needs to be increased.

Referring now to FIG. 4A, a cross-sectional illustration of a device 400 is shown, in accordance with an embodiment. In an embodiment, the device 400 may comprise a substrate 406 and a stack of alternating layers. The substrate 406 may be any substrate such as those described above. The alternating layers may comprise semiconductor layers 438 and sacrificial layers 437. The semiconductor layers 438 are the material that will form the nanowires. The semiconductor layers 438 and sacrificial layers 437 may each be a material such as, but not limited to, silicon, germanium, SiGe, GaAs, InSb, GaP, GaSb, InAlAs, InGaAs, GaSbP, GaAsSb, and InP. In a specific embodiment, the semiconductor layers 438 are silicon and the sacrificial layers 437 are SiGe. In another specific embodiment, the semiconductor layers 438 are germanium, and the sacrificial layers 437 are SiGe. In the illustrated embodiment, a first layer 441 is a sacrificial layer 437, a second layer 442 is a semiconductor layer 438, a third layer 443 is a sacrificial layer 437, and a fourth layer 444 is a semiconductor layer 438.

Referring now to FIG. 4B, a cross-sectional illustration of the device 400 after a first patterning operation is shown, in accordance with an embodiment. In an embodiment, the patterning process may include disposing a resist 470 and patterning the resist 470. The remaining portion of the resist 470 may cover the stack in a first region $404_A$ and expose a second region $404_B$. The resist 470 is used as a mask during an etching process that etches away the portion of the semiconductor layer 438 in the fourth layer 444 of the second region $404_B$. As shown, a portion of the sacrificial layer 437 in the third layer 443 is now the topmost layer in the second region $404_B$.

Referring now to FIG. 4C, a cross-sectional illustration of the device 400 after an additional sacrificial layer 437 is disposed over the top surfaces of the stack after the resist 470 is removed is shown, in accordance with an embodiment. Due to the non uniform height between the first region $404_A$ and the second region $404_B$, the deposited sacrificial layer 437 is split between two of the layers. Particularly, the deposited sacrificial layer 437 in the first region $404_A$ is in the fifth layer 445, and the deposited sacrificial layer 437 in the second region $404_B$ is in the fourth layer 444.

Referring now to FIG. 4D, a cross-sectional illustration of the device 400 after an additional semiconductor layer 438 is disposed over the top surfaces of the stack is shown, in accordance with an embodiment. Due to the non-uniform height between the first region $404_A$ and the second region $404_B$, the deposited semiconductor layer 438 is split between two of the layers. Particularly, the deposited semiconductor layer 438 in the first region $404_A$ is in the sixth layer 446, and the deposited semiconductor layer 438 in the second region $404_B$ is in the fifth layer 445.

Referring now to FIG. 4E, a cross-sectional illustration of the device 400 after an additional sacrificial layer 437 is disposed over the top surfaces of the stack is shown, in accordance with an embodiment. Due to the non-uniform height between the first region $404_A$ and the second region $404_B$, the deposited sacrificial layer 437 is split between two of the layers. Particularly, the deposited sacrificial layer 437 in the first region $404_A$ is in the seventh layer 447, and the deposited sacrificial layer 437 in the second region $404_B$ is in the sixth layer 446.

Referring now to FIG. 4F, a cross-sectional illustration of the device 400 after an additional semiconductor layer 438 is disposed over the top surfaces of the stack is shown, in accordance with an embodiment. Due to the non-uniform height between the first region $404_A$ and the second region $404_B$, the deposited semiconductor layer 438 is split between two of the layers. Particularly, the deposited semiconductor layer 438 in the first region $404_A$ is in the eighth layer 448, and the deposited semiconductor layer 438 in the second region $404_B$ is in the seventh layer 447.

Referring now to FIG. 4G, a cross-sectional illustration of the device 400 after a second patterning operation is shown, in accordance with an embodiment. In an embodiment, the patterning process may include disposing a resist 470 and patterning the resist 470. The remaining portion of the resist 470 may cover the stack in the first region $404_A$ and expose the second region $404_B$. The resist 470 is used as a mask during an etching process that etches away the portion of the semiconductor layer 438 in the seventh layer 447 of the second region $404_B$. As shown, a portion of the sacrificial layer 437 in the sixth layer 446 is now the topmost layer in the second region $404_B$.

Referring now to FIG. 4H, a cross-sectional illustration of the device 400 after an additional sacrificial layer 437 is disposed over the top surfaces of the stack after the resist 470 is removed is shown, in accordance with an embodiment. Due to the non uniform height between the first region $404_A$ and the second region $404_B$, the deposited sacrificial layer 437 is split between two of the layers. Particularly, the deposited sacrificial layer 437 in the first region $404_A$ is in the ninth layer 449, and the deposited sacrificial layer 437 in the second region $404_B$ is in the seventh layer 447.

Referring now to FIG. 4I, a cross-sectional illustration of the device 400 after a capping layer 461 is disposed over the stack of layers. The capping layer 461 may be polished to have a planar top surface. This results in a portion of the capping layer 461 over the first region $404_A$ having a smaller thickness than a portion of the capping layer 461 over the second region $404_B$. In an embodiment, the stack of layers in the first region $404_A$ may be referred to as stack 435 and the stack of layers in the second region $404_B$ may be referred to as stack 436.

Such a patterning process results in non-uniform spacing between the semiconductor layers 438. In the first region $404_A$, the semiconductor layers 438 in stack 435 are spaced apart from each other by a single sacrificial layer 437 (e.g., the sacrificial layer 437 in the third layer 443 separates the semiconductor layer 438 in the fourth layer 444 from the semiconductor layer 438 in the second layer 442). In the second region $404_B$, the semiconductor layers 438 in stack 436 are spaced apart by a pair of sacrificial layers 437 (e.g., the sacrificial layers 437 in the third layer 443 and the fourth layer 444 separate the semiconductor layer 438 in the second layer 442 from the semiconductor layer 438 in the fifth layer 445). Additionally, each of the resulting semiconductor layers 438 (in both the first region $404_A$ and the second region $404_B$) have a substantially similar thickness.

Referring now to FIG. 4J, a cross-sectional illustration of the device 400 after the stacks 435 and 436 are patterned to form a plurality of fins 408 is shown, in accordance with an embodiment. In the illustrated embodiment, first fins $408_A$ are formed in the first region $404_A$ and second fins $408_B$ are formed in the second region $404_B$. The patterned semiconductor layers 438 are now referred to as nanoribbons 410 (i.e., first nanoribbons $410_A$ and second nanoribbons $410_B$). Accordingly, fins 408 with a non uniform nanoribbon spacing are provided on the same substrate 406, using a single process flow.

The illustrated embodiment depicts the formation of two semiconductor layers 438 in the second region $404_B$. However, it is to be appreciated that the previous processing operations may be repeated any number of times to provide a desired number of semiconductor layers 438 in the second region $404_B$. In an embodiment, the number of semiconductor layers 438 in the first region $404_A$ may be an integer multiple of the number of semiconductor layers 438 in the second region $404_B$.

In the illustrated embodiment, the etching process etches through the alternating layers down into the substrate 406. In an embodiment, an isolation layer (not shown) may fill the channels between the fins 408. In the case where the fins 408 extend into the substrate 406, the isolation layer may extend up to approximately the bottommost sacrificial layer 437. In the illustrated embodiment, the fins 408 are depicted as having substantially vertical sidewalls along their entire height. In some embodiments, the sidewalls of the fins 408 may include non-vertical portions. For example, the bottom of the fins proximate to the substrate 406 may have a footing or other similar structural feature typical of high aspect ratio features formed with dry etching processes. Additionally, the profile of all fins 408 may not be uniform. For example, a nested fin 408 may have a different profile than an isolated fin 408 or a fin 408 that is the outermost fin 408 of a grouping of fins 408.

Referring now to FIG. 4K, a cross-sectional illustration of a device 400 along the length of the fins $408_A$ and $408_B$ is shown, in accordance with an embodiment. The illustrated embodiment depicts a break 404 along the length of the substrate 406. The break 404 may be at some point along a single fin 408. That is, the first fin $408_A$ and the second fin $408_B$ may be part of a single fin that has both types of nanoribbon spacing. Alternatively, the second fin $408_B$ may be located on a different fin than the first fin $408_A$. That is, in some embodiments, the break 404 does not represent a gap within a single fin 208.

Referring now to FIG. 4L, a cross-sectional illustration after sacrificial gate structures 471 are disposed over the fins 408 and the fins 408 are patterned to form source/drain openings 472 is shown, in accordance with an embodiment. In an embodiment, a sacrificial gate 471 is disposed over each fin $408_A$ and $408_B$. Following formation of the sacrificial gate 471, portions of the fins $408_A$ and $408_B$ may be removed to form source/drain openings 472. A spacer 422 may also be disposed on opposite ends of the sacrificial gate 471. The spacer 422 may cover sidewall portions of the sacrificial layers 437, and the nanoribbons $410_A$ and $410_B$ may pass through the spacer 422. It is to be appreciated that the sacrificial gate 471 and the spacers 422 will wrap down over sidewalls of the fins 408 (i.e., into and out of the plane of FIG. 4L).

Referring now to FIG. 4M, a cross-sectional illustration after source/drain regions 420 are formed is shown, in accordance with an embodiment. In an embodiment, the source/drain regions 420 may be formed with an epitaxial growth process. The source/drain regions 420 may be formed with materials and processes such as those described in greater detail above.

Referring now to FIG. 4N, a cross-sectional illustration after the sacrificial gates 471 are removed is shown, in accordance with an embodiment. The sacrificial gates 471 may be removed with any suitable etching process. After removal of the sacrificial gates 471 the remaining portions of the sacrificial layers 437 are removed. In an embodiment, an etching process selective to the sacrificial layer 437 with respect to the nanoribbons $410_A$ and $410_B$ is used to remove the sacrificial layers 437. In an embodiment, the selectivity of the etchant is greater than 100:1. In an embodiment where nanoribbons 410 are silicon and sacrificial layers 437 are silicon germanium, sacrificial layers 437 are selectively removed using a wet etchant such as, but not limited to, aqueous carboxylic acid/nitric acid/HF solution and aqueous citric acid/nitric acid/HF solution. In an embodiment where nanoribbons 410 are germanium and sacrificial layers 437 are silicon germanium, sacrificial layers 437 are selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution. In another embodiment, sacrificial layers 437 are removed by a combination of wet and dry etch processes. In an embodiment, the removal of the sacrificial gates 471 and the sacrificial layers 437 provides openings 473 between the spacers 422.

The openings 473 expose the nanoribbons 410. As shown, the first nanoribbons 410$_A$ include a first spacing S$_A$ that is less than a second spacing S$_B$ of the second nanoribbons 410$_B$. Accordingly, there is more room around the second nanoribbons 410$_B$ to grow a thicker gate dielectric.

Referring now to FIG. 4O, a cross-sectional illustration after a gate dielectric layer 415 is disposed over the nanoribbons 410 is shown, in accordance with an embodiment. In the illustrated embodiment, the first gate dielectric 415$_A$ has a first thickness T$_{DA}$ that is less than a second thickness T$_{DB}$ of the second gate dielectric 415$_B$. In an embodiment, the gate dielectrics 415 may be deposited with an ALD process. As such, the gate dielectrics 415 may also deposit along the substrate 406 and the interior sidewalls of the spacers 422.

In an embodiment, the first and second gate dielectrics 415$_A$ and 415$_B$ may be deposited with different processes and materials. For example, the first nanoribbons 410$_A$ may be masked during the deposition of the second gate dielectric 415$_B$, and the second nanoribbons 410$_B$ may be masked during the deposition of the first gate dielectric 415$_A$. In other embodiments, the first gate dielectric 415$_A$ and the second gate dielectric 415$_B$ may be deposited at the same time. When the desired thickness of the first gate dielectric 415$_A$ is reached, the first nanoribbons 410$_A$ are masked and the deposition may continue to increase the thickness of the second gate dielectric 415$_B$.

Referring now to FIG. 4P, a cross-sectional illustration after a gate electrode 430 is disposed around the nanoribbons 410 is shown, in accordance with an embodiment. In an embodiment, the gate electrode 430 wraps around each of the nanoribbons 410 in order to provide GAA control of each nanoribbon 410. The gate electrode material may be deposited with any suitable deposition process (e.g., chemical vapor deposition (CVD), ALD, etc.).

In an embodiment, a single material may be used for the gate electrode 430 even between N-type and P-type transistors. Such embodiments are possible by controlling the VT of the devices using different gate dielectric configurations and treatments. For example, anneals of various gate dielectric materials, such as those described above with respect to FIGS. 3A-3D, may be used to modulate the VT.

Referring now to FIGS. 5A-5L, a series of cross-sectional illustrations depicting a process for forming a pair of nanoribbon transistors with different gate dielectric thicknesses is shown, in accordance with an embodiment. The process illustrated includes the use of an oxidation process to deposit the gate dielectric. In order to provide a thick gate dielectric with an oxidation process that consumes a portion of the nanoribbon, the original thickness of the nanoribbon needs to be increased. Accordingly, the process in FIGS. 5A-5L include the formation of a stack with non-uniform nanoribbon thicknesses.

Figure 5A:
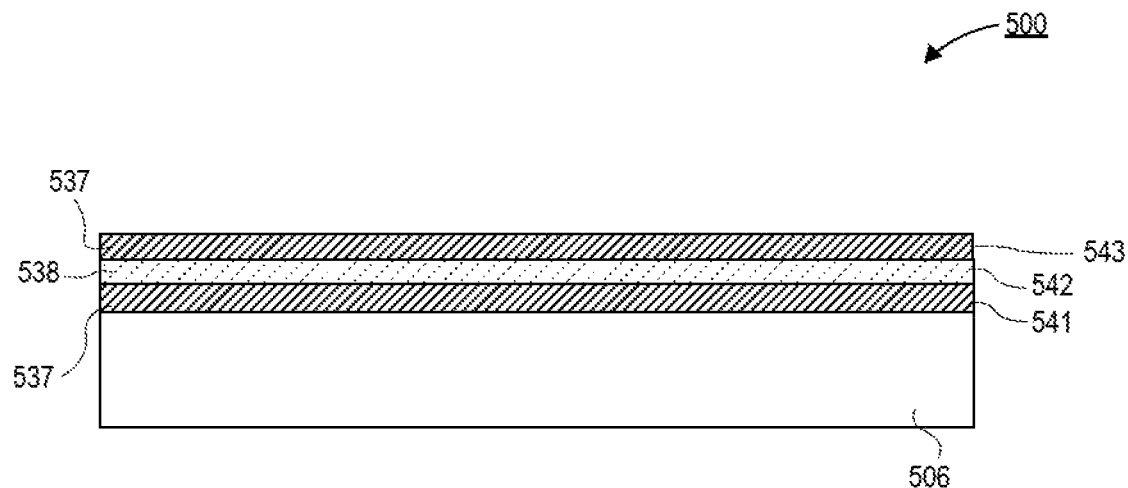
FIGS. 5A-5L are cross-sectional illustrations depicting a process to form nanoribbon transistors with non-uniform gate dielectric thicknesses, where the gate dielectric is disposed with an oxidation process, in accordance with an embodiment.

Referring now to FIG. 5A, a cross-sectional illustration of a device 500 is shown, in accordance with an embodiment. In an embodiment, the device 500 may comprise a substrate 506 and a stack of alternating layers. The substrate 506 may be any substrate such as those described above. The alternating layers may comprise semiconductor layers 538 and sacrificial layers 537. The semiconductor layers 438 are the material that will form the nanoribbons. In a specific embodiment, the semiconductor layers 538 are silicon and the sacrificial layers 537 are SiGe. In another specific embodiment, the semiconductor layers 538 are germanium, and the sacrificial layers 537 are SiGe. In the illustrated embodiment, a first layer 541 is a sacrificial layer 537, a second layer 542 is a semiconductor layer 538, and a third layer 543 is a sacrificial layer 537.

Figure 5B:
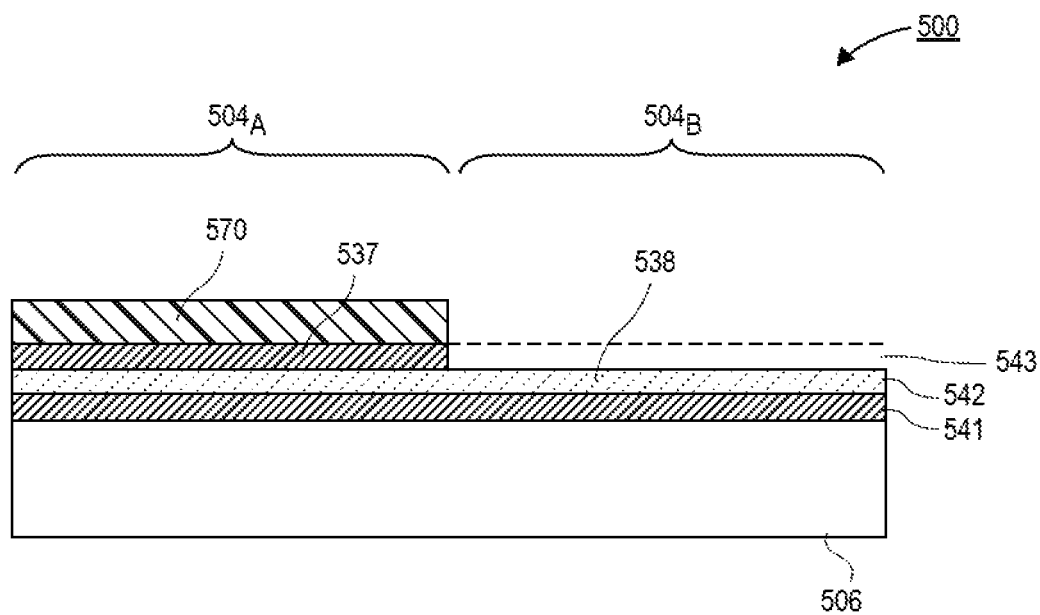

Referring now to FIG. 5B, a cross-sectional illustration of the device 500 after a first patterning operation is shown, in accordance with an embodiment. In an embodiment, the patterning process may include disposing a resist 570 and patterning the resist 570. The remaining portion of the resist 570 may cover the stack in a first region 504$_A$ and expose a second region 504$_B$. The resist 570 is used as a mask during an etching process that etches away the portion of the sacrificial layer 537 in the third layer 543 of the second region 504$_B$. As shown, a portion of the sacrificial layer 537 in the second layer 542 is now the topmost layer in the second region 504$_B$.

Figure 5C:
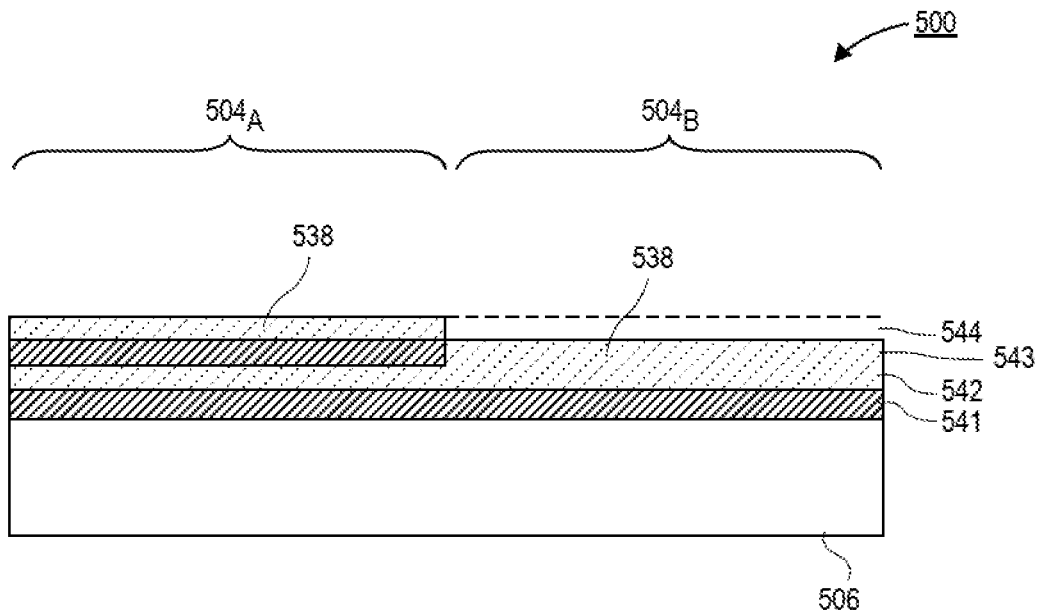

Referring now to FIG. 5C, a cross-sectional illustration of the device 500 after an additional semiconductor layer 538 is disposed over the top surfaces of the stack is shown, in accordance with an embodiment. Due to the non-uniform height between the first region 504$_A$ and the second region 504$_B$, the deposited semiconductor layer 538 is split between two of the layers. Particularly, the deposited semiconductor layer 538 in the first region 504$_A$ is in the fourth layer 544, and the deposited semiconductor layer 538 in the second region 504$_B$ is in the third layer 543.

Figure 5D:
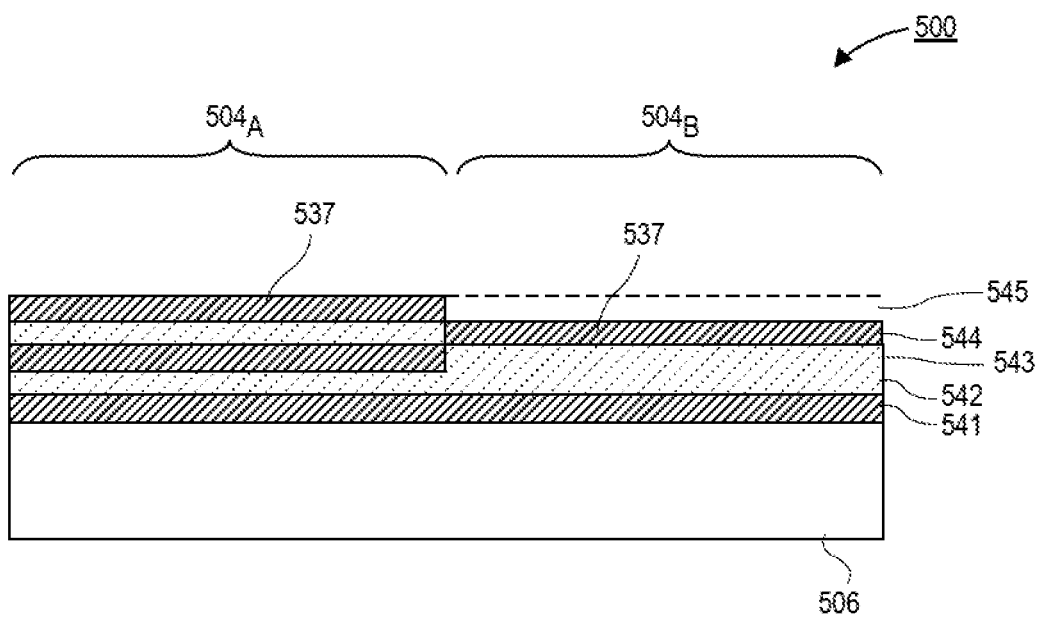

Referring now to FIG. 5D, a cross-sectional illustration of the device 500 after an additional sacrificial layer 537 is disposed over the top surfaces of the stack is shown, in accordance with an embodiment. Due to the non-uniform height between the first region 504$_A$ and the second region 504$_B$, the deposited sacrificial layer 537 is split between two of the layers. Particularly, the deposited sacrificial layer 537 in the first region 504$_A$ is in the fifth layer 545, and the deposited sacrificial layer 537 in the second region 504$_B$ is in the fourth layer 544.

Figure 5E:
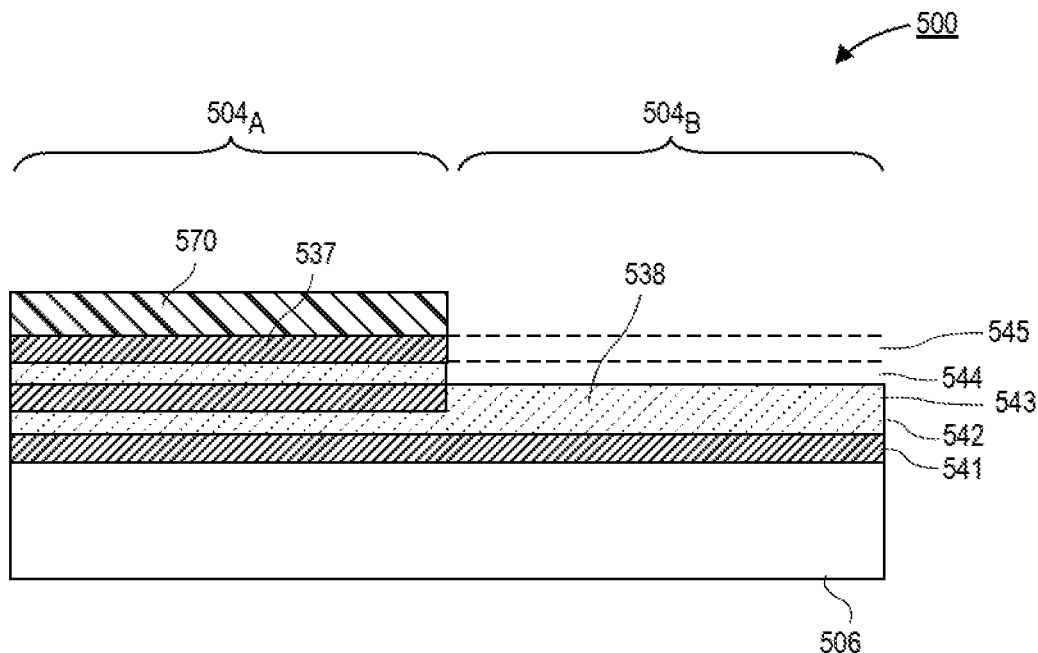

Referring now to FIG. 5E, a cross-sectional illustration of the device 500 after a second patterning operation is shown, in accordance with an embodiment. In an embodiment, the patterning process may include disposing a resist 570 and patterning the resist 570. The remaining portion of the resist 570 may cover the stack in the first region 504$_A$ and expose the second region 504$_B$. The resist 570 is used as a mask during an etching process that etches away the portion of the sacrificial layer 537 in the fourth layer 544 of the second region 504$_B$. As shown, a portion of the semiconductor layer 538 in the third layer 543 is now the topmost layer in the second region 504$_B$.

Figure 5F:
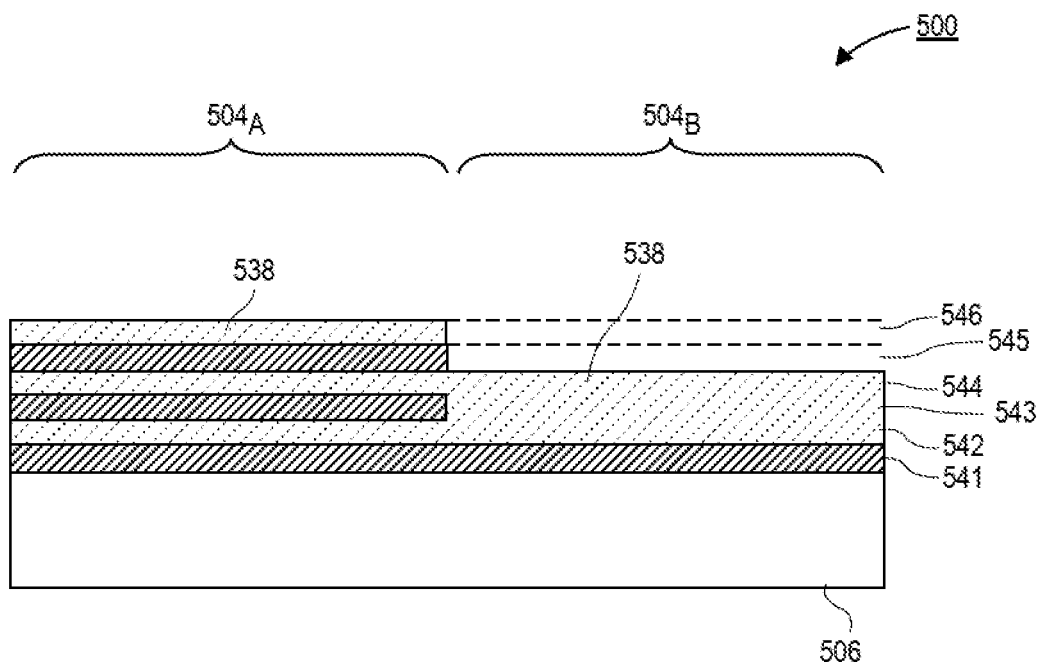

Referring now to FIG. 5F, a cross-sectional illustration of the device 500 after an additional semiconductor layer 538 is disposed over the top surfaces of the stack is shown, in accordance with an embodiment. Due to the non-uniform height between the first region 504$_A$ and the second region $504_B$, the deposited semiconductor layer 538 is split between two of the layers. Particularly, the deposited semiconductor layer 538 in the first region $504_A$ is in the sixth layer 546, and the deposited semiconductor layer 538 in the second region $504_B$ is in the fourth layer 544.

Figure 5G:
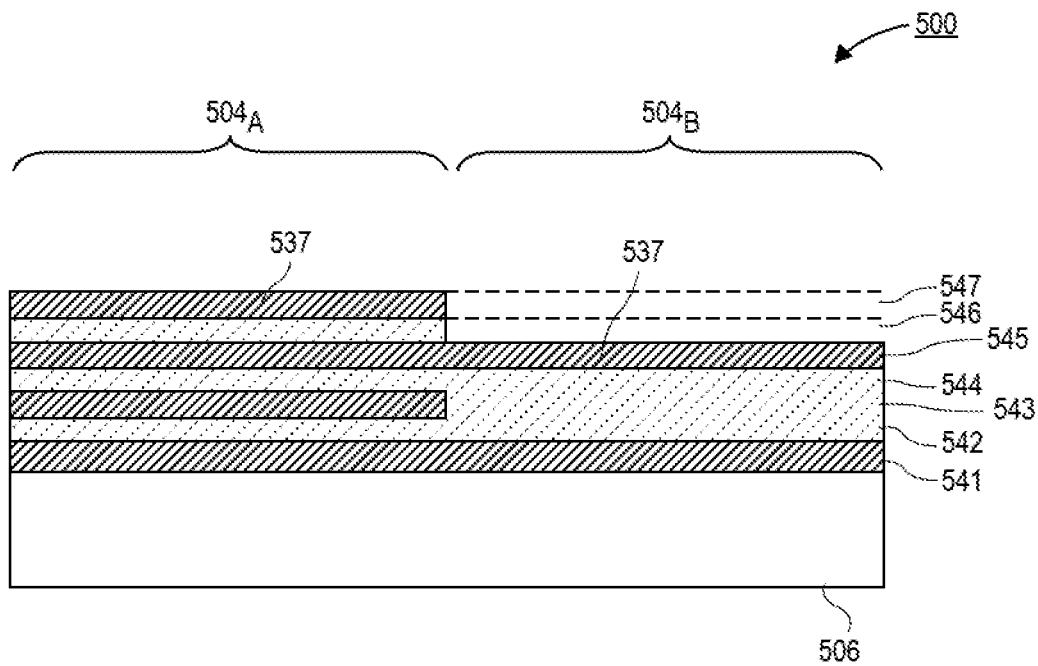

Referring now to FIG. 5G, a cross-sectional illustration of the device 500 after an additional sacrificial layer 537 is disposed over the top surfaces of the stack is shown, in accordance with an embodiment. Due to the non-uniform height between the first region $504_A$ and the second region $504_B$, the deposited sacrificial layer 537 is split between two of the layers. Particularly, the deposited sacrificial layer 537 in the first region $504_A$ is in the seventh layer 547, and the deposited sacrificial layer 537 in the second region $504_B$ is in the fifth layer 545.

Figure 5H:
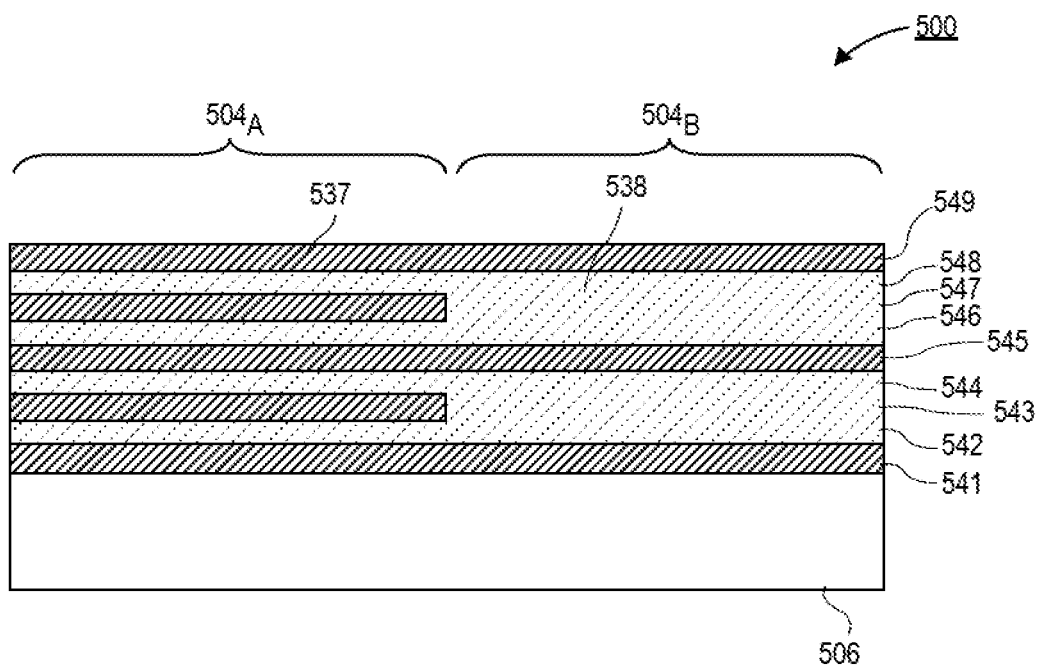

In an embodiment, the processing operations in FIGS. 5A-5G may be repeated any number of times to provide a desired number of thick semiconductor layers in the second region $504_B$. For example, FIG. 5H is a cross-sectional illustration after a pair of thick semiconductor layers 538 are formed in the second region $504_B$. In FIG. 5H, the height of the first region $504_A$ and the height of the second region $504_B$ are shown as being planar with each other. For example, a planarization process may have been implemented in order to reduce the height of the first region $504_A$ back to the sacrificial layer 537 in the ninth layer 549.

In an embodiment, each thick semiconductor layer 538 in the second region $504_B$ may have a thickness that is greater than a thickness of the semiconductor layers 538 in the first region $504_A$. In a particular embodiment, the semiconductor layers 538 in the second region $504_B$ are three times larger than the thickness of the semiconductor layers 538 in the first region $504_A$. For example, each of the semiconductor layers 538 in the second region $504_B$ extend into three layers (e.g., layers 542-544 or layers 546-548). In an embodiment, the thickness of the semiconductor layers 538 in the second region $504_B$ is an integer multiple of the thickness of the semiconductor layers 538 in the first region $504_A$.

Subsequent to the formation of the layers 541-549 over the substrate 506, the layers may be patterned into a plurality of fins having a profile similar to the profile of fins 408 illustrated in FIG. 4J.

Figure 5I:
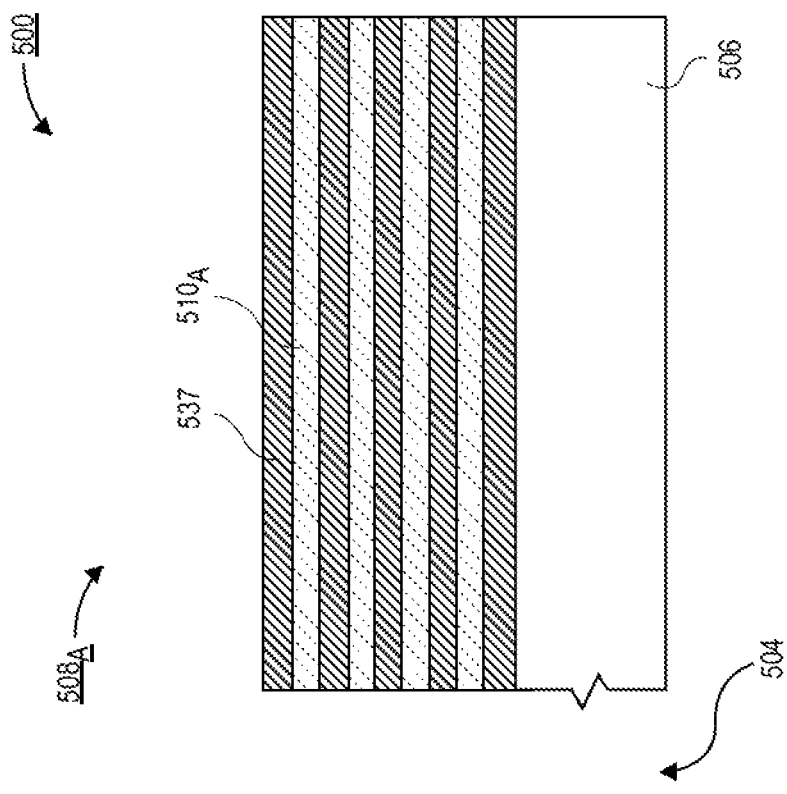
Figure 5I:
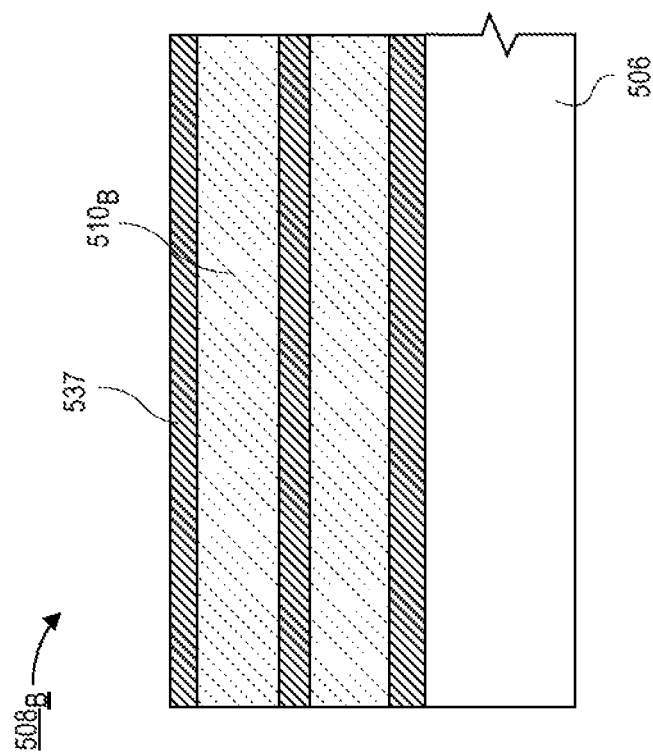

Referring now to FIG. 5I, a cross-sectional illustration of a device 500 along the length of a first fin $508_A$ and a second fin $508_B$ is shown, in accordance with an embodiment. The first fin $508_A$ will have a stack of first nanoribbons $510_A$ and sacrificial layers 537 similar to the stack in the first region $504_A$ of FIG. 5H, and the second fin $508_B$ will have a stack of second nanoribbons $510_B$ and sacrificial layers 537 similar to the stack in the second region $504_B$ of FIG. 5H. That is, the second fin $508_B$ will have second nanoribbons $510_B$ that have a thickness greater than a thickness of the first nanoribbons $510_A$.

The illustrated embodiment depicts a break 504 along the length of the substrate 506. The break 504 may be at some point along a single fin 508. That is, the first fin $508_A$ and the second fin $508_B$ may be part of a single fin that has both types of nanoribbon thicknesses. Alternatively, the second fin $508_B$ may be located on a different fin than the first fin $508_A$. That is, in some embodiments, the break 504 does not represent a gap within a single fin 508.

Figure 5J:
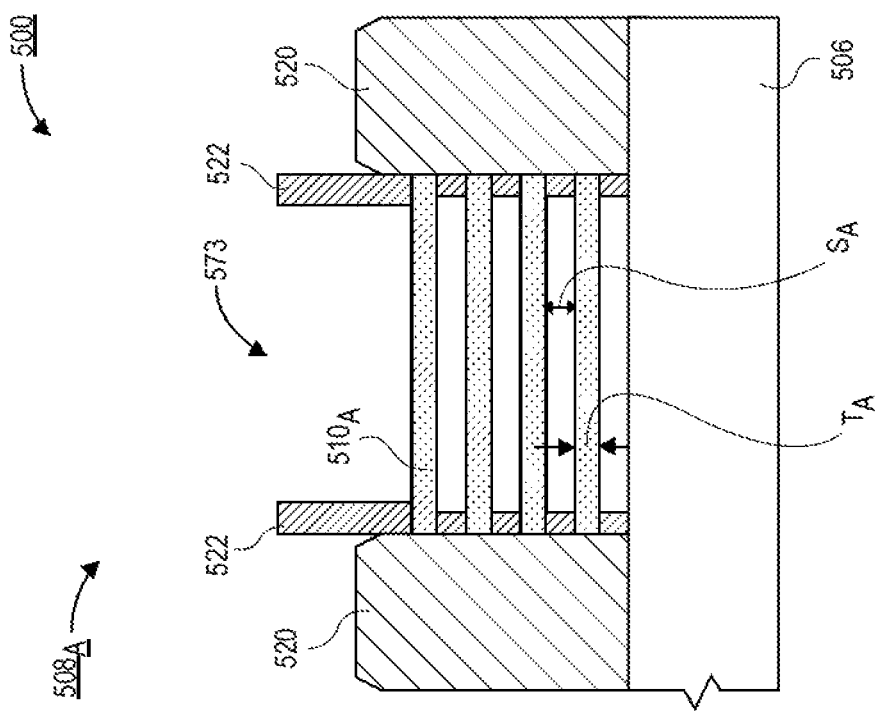
Figure 5J:
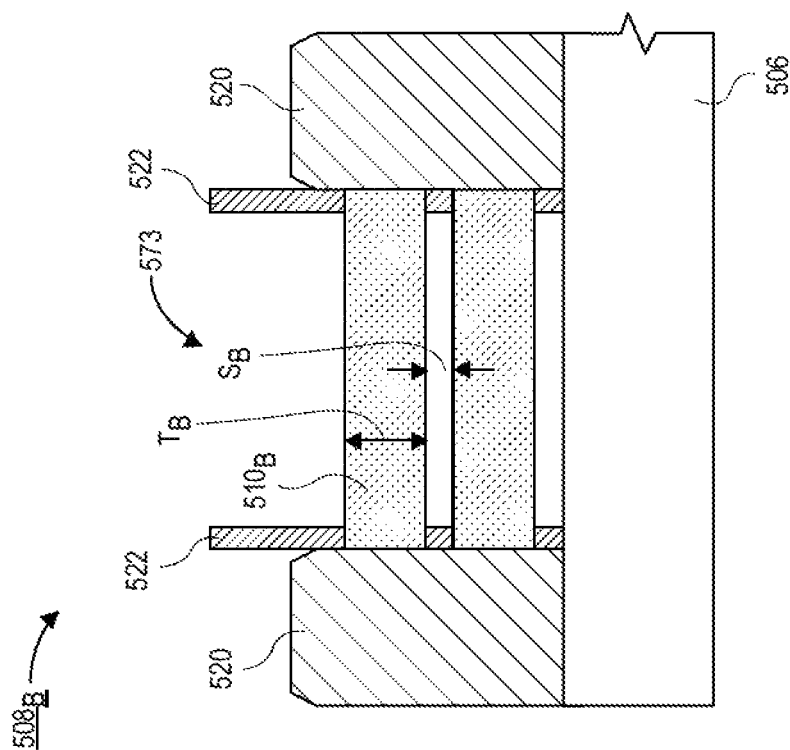

Referring now to FIG. 5J, a cross-sectional of the device 500 after various processing operations have been implemented to provide openings 573 over channel regions of the first nanoribbons $510_A$ and the second nanoribbons $510_B$ is shown, in accordance with an embodiment. In an embodiment, the processing operations implemented between FIG. 5I and FIG. 5J may be substantially similar to the processing operations shown and described with respect to FIGS. 4L-4N. To briefly summarize the processing operations, a sacrificial gate (not shown) is disposed and spacers 522 are formed. Openings for source/drain regions 520 are formed, and the source/drain regions 520 are grown (e.g., with an epitaxial process). The sacrificial gate is then removed and the sacrificial layers 537 are selectively etched to expose the first nanoribbons $510_A$ and the second nanoribbons $510_B$.

In an embodiment, the first nanoribbons $510_A$ have a first thickness $T_A$ and the second nanoribbons $510_B$ have a second thickness TB that is greater than the first thickness $T_A$. In some embodiments, a first spacing between the first nanoribbons $510_A$ is substantially similar to a second spacing between the second nanoribbons $510_B$.

Figure 5K:
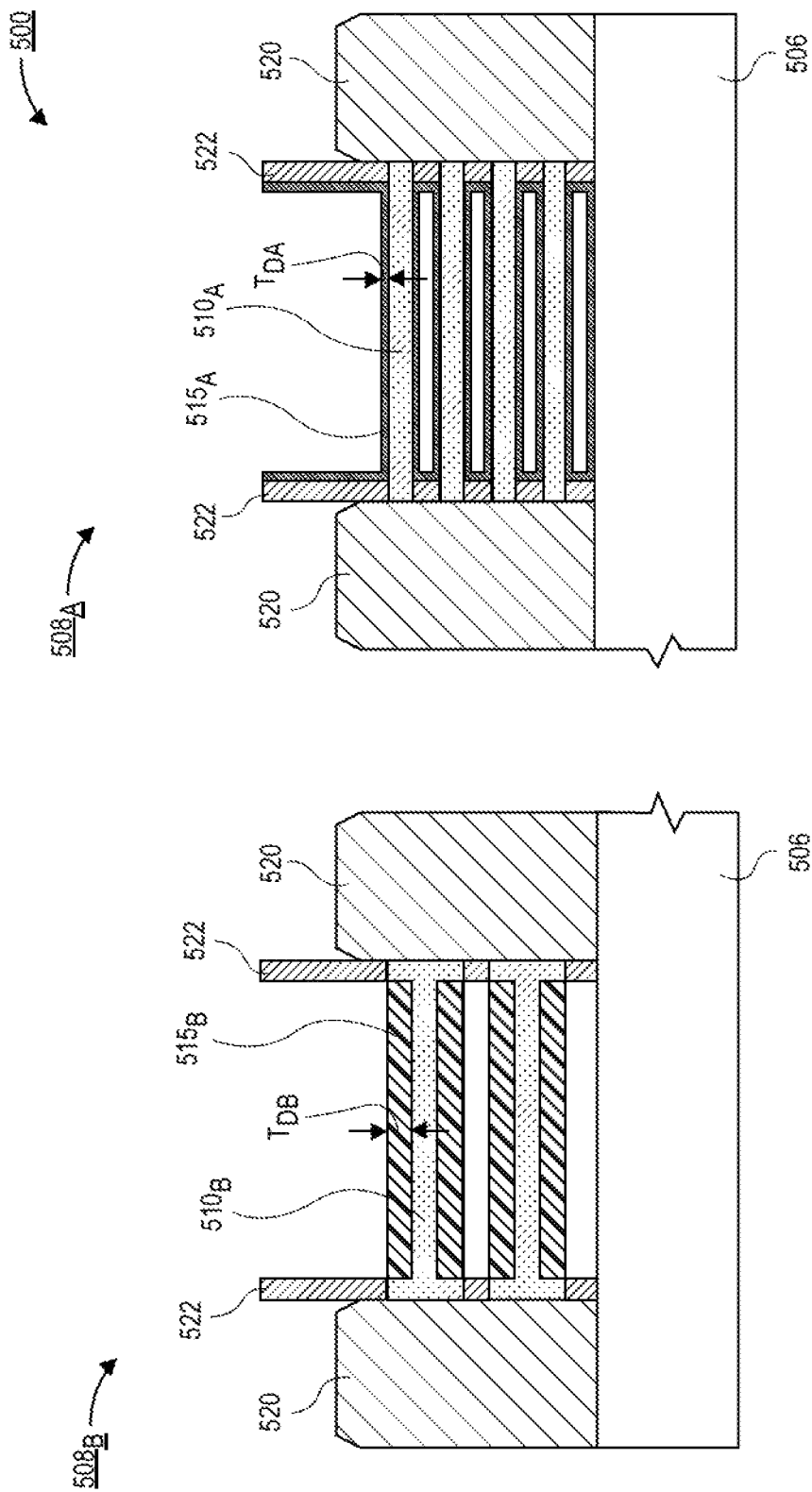

Referring now to FIG. 5K, a cross-sectional illustration of the device 500 after a first gate dielectric $515_A$ and a second gate dielectric $515_B$ is disposed is shown, in accordance with an embodiment. In a particular embodiment, the second gate dielectric $515_B$ may be formed with an oxidation process. That is, portions of the second nanoribbons $510_B$ may be consumed to provide the second gate dielectric $515_B$. Since the second gate dielectric $515_B$ is disposed with an oxidation process, the interior sidewalls of the spacers 522 are not covered by the second gate dielectric $515_B$. While not illustrated, in some embodiments, portions of the substrate 506 may also be oxidized. In an embodiment, the second gate dielectric $515_B$ may also be annealed after formation.

In an embodiment, the spacers 522 protect portions of the second nanoribbons $510_B$ from being oxidized. Accordingly, the portion of the second nanoribbons $510_B$ within the spacer 522 may have the original thickness, and the portion of the nanoribbons $510_B$ in the channel region will have a smaller thickness.

In an embodiment, the first and second gate dielectrics $515_A$ and $515_B$ may be deposited with different processes and materials. For example, the first nanoribbons $510_A$ may be masked during the oxidation process used to form the second gate dielectric $515_B$, and the second nanoribbons $510_B$ may be masked during the deposition of the first gate dielectric $515_A$. In other embodiments, the first gate dielectric $515_A$ and the second gate dielectric $515_B$ may be formed with a single oxidation process. When the desired thickness of the first gate dielectric $515_A$ is reached, the first nanoribbons $510_A$ are masked and the oxidation may continue to increase the thickness of the second gate dielectric $515_B$.

Figure 5L:
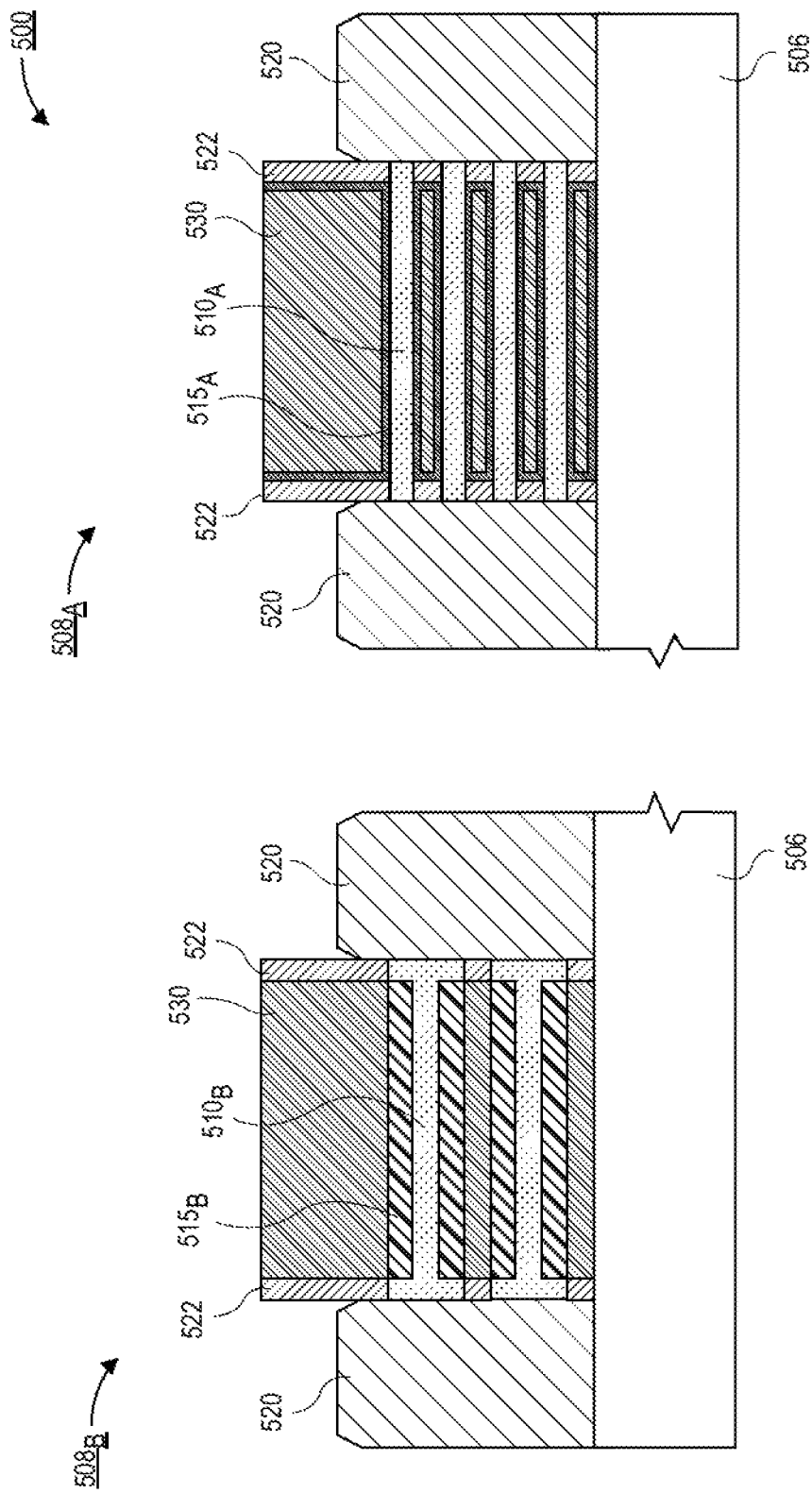

Referring now to FIG. 5L, a cross-sectional illustration after a gate electrode 530 is disposed around the nanoribbons 510 is shown, in accordance with an embodiment. In an embodiment, the gate electrode 530 wraps around each of the nanoribbons 510 in order to provide GAA control of each nanoribbon 510. The gate electrode material may be deposited with any suitable deposition process (e.g., chemical vapor deposition (CVD), ALD, etc.).

In an embodiment, a single material may be used for the gate electrode 530 even between N-type and P-type transistors. Such embodiments are possible by controlling the VT of the devices using different gate dielectric configurations and treatments. For example, anneals of various gate dielectric materials, such as those described above with respect to FIGS. 3A-3D, may be used to modulate the VT.

Figure 6:
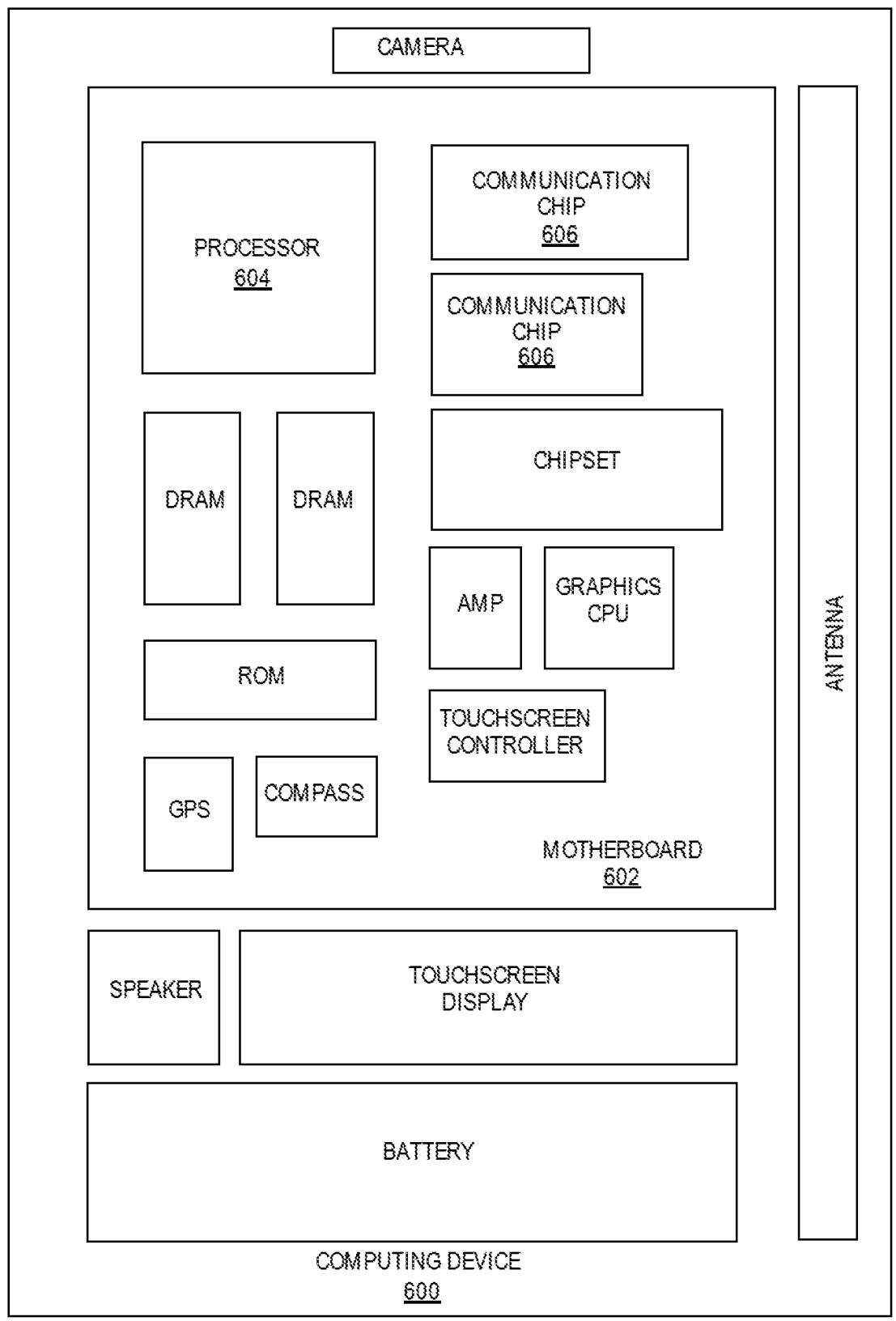
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor may comprise nanowire transistor devices with non-uniform gate dielectric thicknesses, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip 606 may comprise nanowire transistor devices with non-uniform gate dielectric thicknesses, as described herein.

In further implementations, another component housed within the computing device 600 may comprise nanowire transistor devices with non-uniform gate dielectric thicknesses, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
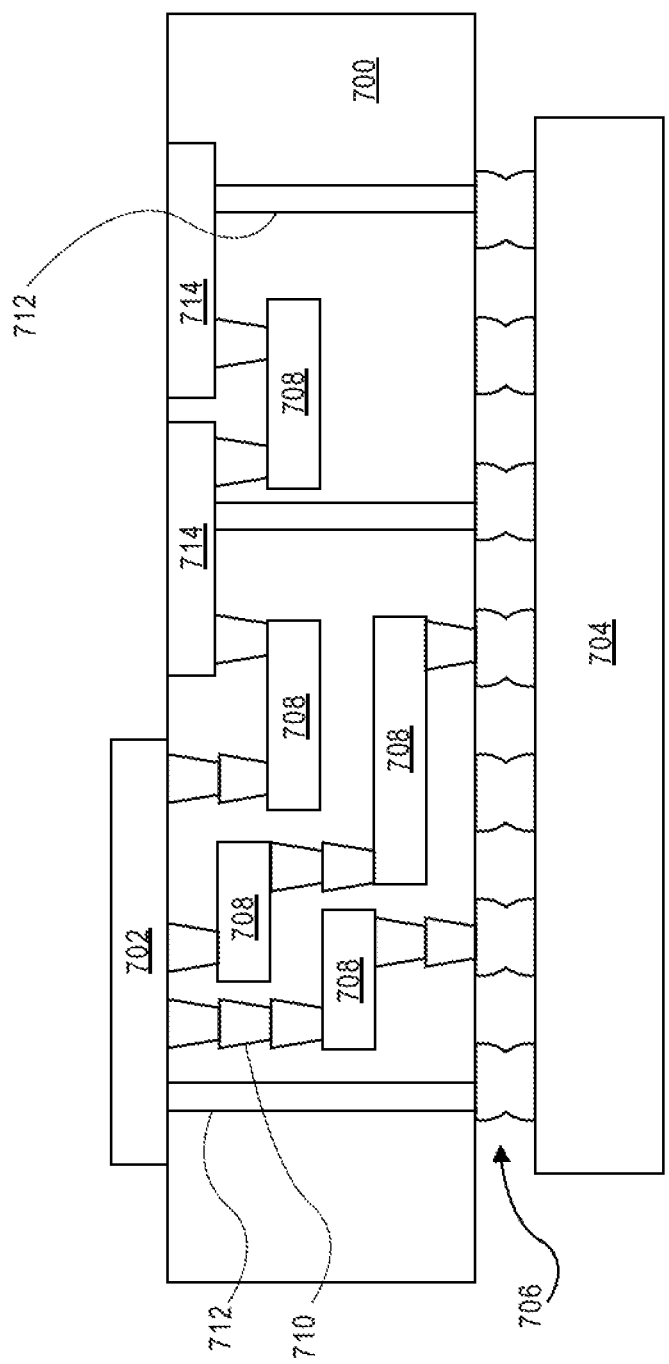
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may comprise nanowire transistor devices with non-uniform gate dielectric thicknesses, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise semiconductor devices that comprise nanowire transistor devices with graded tip regions, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a substrate; a plurality of first semiconductor layers in a vertical stack over the substrate, wherein the first semiconductor layers have a first spacing; a first dielectric surrounding each of the first semiconductor layers, wherein the first dielectric has a first thickness; a plurality of second semiconductor layers in a vertical stack over the substrate, wherein the second semiconductor layers have a second spacing that is greater than the first spacing; and a second dielectric surrounding each of the second semiconductor layers, wherein the second dielectric has a second thickness that is greater than the first thickness.

Example 2: the semiconductor device of Example 1, wherein the first semiconductor layers and the second semiconductor layers are nanowires or nanoribbons.

Example 3: the semiconductor device of Example 1 or Example 2, wherein a surface facing the substrate of a bottommost first semiconductor layer is aligned with a surface facing the substrate of a bottommost second semiconductor layer.

Example 4: the semiconductor device of Example 1 or Example 2, wherein a surface facing the substrate of a bottommost first semiconductor layer is misaligned with a surface facing the substrate of a bottommost second semiconductor layer.

Example 5: the semiconductor device of Examples 1-4, wherein the second gate dielectric comprises: a first dielectric layer over the second semiconductor layers; and a second dielectric layer over the first dielectric layer.

Example 6: the semiconductor device of Example 5, wherein the first dielectric layer is an oxide, and wherein the second dielectric layer is a dipole material.

Example 7: the semiconductor device of Example 6, wherein the first dielectric layer is $SiO_2$ or $HfO_2$ and wherein the second dielectric layer comprises one or more of $La_2O_3$, $ZrO_2$, and $TiO_2$.

Example 8: a semiconductor device, comprising: a substrate a first transistor over the substrate, wherein the first transistor comprises: a plurality of first nanoribbons, the first nanoribbons arranged in a vertical stack with a first spacing between each first nanoribbon; a first gate structure over the plurality first nanoribbons, the first gate structure defining a first channel region of the plurality of first nanoribbons, wherein the first gate structure comprises: a first gate dielectric wrapping around the plurality of first nanoribbons, the first gate dielectric having a first thickness; and a first gate electrode wrapping around the first gate dielectric; and a second transistor over the substrate, wherein the second transistor comprises: a plurality of second nanoribbons, the second nanoribbons arranged in a vertical stack with a second spacing between each second nanoribbon, wherein the second spacing is greater than the first spacing; a second gate structure over the plurality second nanoribbons, the second gate structure defining a second channel region of the plurality of second nanoribbons, wherein the first gate structure comprises: a second gate dielectric wrapping around the plurality of second nanoribbons, the second gate dielectric having a second thickness that is greater than the first thickness; and a second gate electrode wrapping around the second gate dielectric.

Example 9: the semiconductor device of Example 8, wherein the second spacing is an integer multiple of the first spacing.

Example 10: the semiconductor device of Example 9, wherein the second spacing is twice the first spacing.

Example 11: the semiconductor device of Examples 8-10, wherein a bottommost second nanoribbon is aligned with a bottommost first nanoribbon.

Example 12: the semiconductor device of Examples 8-11, wherein a thickness of each first nanoribbon is substantially similar to a thickness of each second nanoribbon.

Example 13: the semiconductor device of Examples 8-11, wherein there are more first nanoribbons than second nanoribbons.

Example 14: the semiconductor device of Example 13, wherein the number of first nanoribbons is an integer multiple of the number of second nanoribbons.

Example 15 the semiconductor device of Examples 8-14, wherein the second thickness is at least twice the first thickness.

Example 16: the semiconductor device of Examples 8-15, wherein the first spacing is approximately 7 nm or less and wherein the second spacing is approximately 7 nm or greater.

Example 17: a method of forming a semiconductor device, comprising: disposing a multilayer stack of alternating semiconductor layers and sacrificial layers over a substrate, wherein the multilayer stack comprises a first region and a second region, and wherein the multilayer stack in the first region is different than the multilayer stack in the second region; patterning the multi-layer stack into a plurality of fins, wherein a first fin is in the first region and a second fin is in the second region; disposing a sacrificial gate structure over each of the first fin and the second fin, wherein the sacrificial gates define a first channel region of the first fin and a second channel region of the second fin; disposing pairs of source/drain regions on opposite ends of each sacrificial gate structure; removing the sacrificial layers from the channel regions of the first fin and the second fin; disposing a first gate dielectric over the semiconductor layers in the first channel region, wherein the first gate dielectric has a first thickness; and disposing a second gate dielectric over the semiconductor layers in the second channel region, wherein the second gate dielectric has a second thickness that is greater than the first thickness.

Example 18: the method of Example 17, wherein a thickness of the semiconductor layers in the first region is substantially similar to a thickness of the semiconductor layers in the second region, and wherein a spacing between semiconductor layers in the second region is greater than a spacing between semiconductor layers in the first region.

Example 19: the method of Example 18, wherein the second gate dielectric is disposed with an atomic layer deposition (ALD) process.

Example 20: the method of Example 17, wherein a thickness of the semiconductor layers in the first region is smaller than a thickness of the semiconductor layers in the second region, and wherein a spacing between semiconductor layers in the first region is substantially similar to a spacing between semiconductor layers in the second region.

Example 21: the method of Example 20, wherein the second gate dielectric is disposed by oxidizing the semiconductor layers in the second channel region.

Example 22: the method of Examples 17-21, wherein a number of semiconductor layers in the first region is an integer multiple of the number of semiconductor layers in the second region.

Example 23: an electronic device, comprising: a board; an electronic package coupled to the board; and a die electrically coupled to the electronic package, wherein the die comprises: a substrate; a plurality of first semiconductor layers in a vertical stack over the substrate, wherein the first semiconductor layers have a first spacing; a first dielectric surrounding each of the first semiconductor layers, wherein the first dielectric has a first thickness; a plurality of second semiconductor layers in a vertical stack over the substrate, wherein the second semiconductor layers have a second spacing that is greater than the first spacing; and a second dielectric surrounding each of the second semiconductor layers, wherein the second dielectric has a second thickness that is greater than the first thickness.

Example 24: the electronic device of Example 23, wherein the first semiconductor layers and the second semiconductor layers are nanowires or nanoribbons.

Example 25: the electronic device of Example 23 or Example 24, wherein the number of first semiconductor layers is an integer multiple of the number of second semiconductor layers.

What is claimed is:

1. A semiconductor device, comprising:
    a substrate;
    a plurality of first semiconductor layers in a vertical stack over the substrate, wherein the first semiconductor layers have a first spacing;
    a first dielectric surrounding each of the first semiconductor layers, wherein the first dielectric has a first thickness;
    a plurality of second semiconductor layers in a vertical stack over the substrate, wherein the second semiconductor layers have a second spacing that is greater than the first spacing, wherein each one of the plurality of second semiconductor layers has a thickness different than a thickness of each one of the plurality of first semiconductor layers, wherein each one of the plurality of second semiconductor layers has a width different than a width of each one of the plurality of first semiconductor layers, and wherein individual ones of the plurality of second semiconductor layers are staggered with corresponding individual ones of the plurality of first semiconductor layers; and
    a second dielectric surrounding each of the second semiconductor layers, wherein the second dielectric has a second thickness that is greater than the first thickness.

2. The semiconductor device of claim 1, wherein the first semiconductor layers and the second semiconductor layers are nanowires or nanoribbons.

3. The semiconductor device of claim 1, wherein a surface facing the substrate of a bottommost first semiconductor layer is aligned with a surface facing the substrate of a bottommost second semiconductor layer.

4. The semiconductor device of claim 1, wherein a surface facing the substrate of a bottommost first semiconductor layer is misaligned with a surface facing the substrate of a bottommost second semiconductor layer.

5. The semiconductor device of claim 1, wherein the second gate dielectric comprises:
    a first dielectric layer over the second semiconductor layers; and
    a second dielectric layer over the first dielectric layer.

6. The semiconductor device of claim 5, wherein the first dielectric layer is an oxide, and wherein the second dielectric layer is a dipole material.

7. The semiconductor device of claim 6, wherein the first dielectric layer is $SiO_2$ or $HfO_2$ and wherein the second dielectric layer comprises one or more of $La_2O_3$, $ZrO_2$, and $TiO_2$.

8. A semiconductor device, comprising:
    a substrate;
    a first transistor over the substrate, wherein the first transistor comprises:
        a plurality of first nanoribbons, the first nanoribbons arranged in a vertical stack with a first spacing between each first nanoribbon;
        a first gate structure over the plurality first nanoribbons, the first gate structure defining a first channel region of the plurality of first nanoribbons, wherein the first gate structure comprises:
            a first gate dielectric wrapping around the plurality of first nanoribbons, the first gate dielectric having a first thickness; and
            a first gate electrode wrapping around the first gate dielectric; and
    a second transistor over the substrate, wherein the second transistor comprises:
        a plurality of second nanoribbons, the second nanoribbons arranged in a vertical stack with a second spacing between each second nanoribbon, wherein the second spacing is greater than the first spacing, wherein each one of the plurality of second nanoribbons has a thickness different than a thickness of each one of the plurality of first nanoribbons, wherein each one of the plurality of second nanoribbons has a width different than a width of each one of the plurality of first nanoribbons, and wherein individual ones of the plurality of second nanoribbons are staggered with corresponding individual ones of the plurality of first nanoribbons;
        a second gate structure over the plurality second nanoribbons, the second gate structure defining a second channel region of the plurality of second nanoribbons, wherein the first gate structure comprises:
            a second gate dielectric wrapping around the plurality of second nanoribbons, the second gate dielectric having a second thickness that is greater than the first thickness; and
            a second gate electrode wrapping around the second gate dielectric.

9. The semiconductor device of claim 8, wherein the second spacing is an integer multiple of the first spacing.

10. The semiconductor device of claim 9, wherein the second spacing is twice the first spacing.

11. The semiconductor device of claim 8, wherein a bottommost second nanoribbon is aligned with a bottommost first nanoribbon.

12. The semiconductor device of claim 8, wherein there are more first nanoribbons than second nanoribbons.

13. The semiconductor device of claim 12, wherein the number of first nanoribbons is an integer multiple of the number of second nanoribbons.

14. The semiconductor device of claim 8, wherein the second thickness is at least twice the first thickness.

15. The semiconductor device of claim 8, wherein the first spacing is approximately 7 nm or less and wherein the second spacing is approximately 7 nm or greater.

16. An electronic device, comprising:
    a board;
    an electronic package coupled to the board; and
    a die electrically coupled to the electronic package, wherein the die comprises:
        a substrate;
        a plurality of first semiconductor layers in a vertical stack over the substrate, wherein the first semiconductor layers have a first spacing;

a first dielectric surrounding each of the first semiconductor layers, wherein the first dielectric has a first thickness;

a plurality of second semiconductor layers in a vertical stack over the substrate, wherein the second semiconductor layers have a second spacing that is greater than the first spacing, wherein each one of the plurality of second semiconductor layers has a thickness different than a thickness of each one of the plurality of first semiconductor layers, wherein each one of the plurality of second semiconductor layers has a width different than a width of each one of the plurality of first semiconductor layers, and wherein individual ones of the plurality of second semiconductor layers are staggered with corresponding individual ones of the plurality of first semiconductor layers; and a second dielectric surrounding each of the second semiconductor layers, wherein the second dielectric has a second thickness that is greater than the first thickness.

17. The electronic device of claim 16, wherein the first semiconductor layers and the second semiconductor layers are nanowires or nanoribbons.

18. The electronic device of claim 16, wherein the number of first semiconductor layers is an integer multiple of the number of second semiconductor layers.

* * * * *